(12) United States Patent
Braatz

(10) Patent No.: US 12,324,122 B2
(45) Date of Patent: Jun. 3, 2025

(54) PORTABLE AUTONOMOUSLY POWERED COMPUTER WITH THERMALLY SEPARATED HEAT ENERGY SOURCES IN VORTICITY-INDUCING CAVITY

(71) Applicant: Jason C. Braatz, Temple, TX (US)

(72) Inventor: Jason C. Braatz, Temple, TX (US)

( * ) Notice: Subject to any disclaimer, the term of this patent is extended or adjusted under 35 U.S.C. 154(b) by 216 days.

(21) Appl. No.: 18/311,788

(22) Filed: May 3, 2023

(65) Prior Publication Data
US 2024/0015917 A1 Jan. 11, 2024

Related U.S. Application Data

(60) Provisional application No. 63/364,106, filed on May 3, 2022.

(51) Int. Cl.
*H05K 7/20* (2006.01)
*G06F 1/20* (2006.01)

(52) U.S. Cl.
CPC .......... *H05K 7/20127* (2013.01); *G06F 1/20* (2013.01)

(58) Field of Classification Search
CPC .......... H05K 7/20127; H05K 7/20009; H05K 7/20418; H05K 7/20854; H05K 5/0217; H05K 1/0206; G06F 1/20; B27K 2240/60
See application file for complete search history.

(56) References Cited

U.S. PATENT DOCUMENTS 7,480,145 B2 * 1/2009 Ali .................... H05K 7/20518
257/713

7,957,131 B1 * 6/2011 Mongia .............. H05K 7/20427
361/679.54

(Continued)

FOREIGN PATENT DOCUMENTS

CN 102671916 B 5/2014
WO 2022083159 A1 4/2022

OTHER PUBLICATIONS

Acer, Aspire Vero Be Part of a More Sustainable Future, with a Green PC Made with PCR Material., retrieved from the Internet, https://www.acer.com/us-en/laptops/aspire/aspire-vero/230420.

(Continued)

*Primary Examiner* — Mandeep S Buttar
*Assistant Examiner* — Matthew Sinclair Muir
(74) *Attorney, Agent, or Firm* — Thompson Patent Law Offices PC

(57) ABSTRACT

Apparatus and associated methods relate to a passively cooling computing device (PCCD). For example, a PCCD may include a heat generating electronic components including a processor and a memory. The PCCD may also include a passive cooling structure disposed between the HGECs and a cooling region of the computing device. For example, the passive cooling structure may include an anisotropic surface configured to passively induce air vorticity in response to a thermal gradient. The passive cooling structure may also include a microchannel substructure comprising tubules. For example, when heat energy may be generated from the HGECs, the volume around the HGECs may be in fluid communication with the cooling region by convection generated by a pressure differential and air flow induced by the anisotropic surface texture. Various embodiments may advantageously provide a heat efficient portable computer device.

16 Claims, 25 Drawing Sheets

(56) References Cited

U.S. PATENT DOCUMENTS

| | | | |
|---|---|---|---|
| 10,459,498 | B1 | 10/2019 | Kinstle, III et al. |
| 11,313,773 | B2 | 4/2022 | Liu et al. |
| 12,168,727 | B2 * | 12/2024 | Hu .............................. C08L 1/02 |
| 2003/0047653 | A1 | 3/2003 | Ballard |
| 2017/0293329 | A1 | 10/2017 | Chiriac et al. |
| 2018/0042101 | A1 * | 2/2018 | Avalos ............... H05K 7/20418 |
| 2018/0329464 | A1 | 11/2018 | Lin |
| 2019/0037292 | A1 | 1/2019 | Koss et al. |
| 2021/0066766 | A1 | 3/2021 | Gao |
| 2022/0127454 | A1 | 4/2022 | Abbatiello et al. |
| 2022/0129589 | A1 | 4/2022 | Mani et al. |
| 2022/0130626 | A1 | 4/2022 | Abbatiello et al. |
| 2022/0259412 | A1 | 8/2022 | Hu et al. |

OTHER PUBLICATIONS

ACM SIGCHI, Fabricating Wooden Circuit Boards by Laser Beam Machining, retrieved from the internet Sep. 30, 2022, https://www.youtube.com/watch?v=JrUGSOWX4yQ.

Adafruit, Wood PCBs with Copper Paint Traces, Jan. 5, 2011, retrieved from the internet Sep. 30, 2022, https://blog.adafruit.com/2011/01/05/wood-pcbs-with-copper-paint-traces/.

Barrett, B., All Gaming PCs Should Look as Gorgeous as the Wooden Volta V, retrieved from the internet, https://www.wired.com/2017/02/volta-v-gaming-pc/.

Brothers, R, CNC Milling Wooden Keycaps, retrieved from the internet Nov. 2, 2022, https://learn.adafruit.com/cnc-milling-keycaps?view=all.

Butler, S., Modular Laptops are (Probably) Not the Future, Jan. 7, 2022, retrieved from the internet, https://www.howtogeek.com/771653/modular-laptops-are-probably-not-the-future/.

Croatiaweek, Crolander Wooden Keyboards from Croatia, May 9, 2017, retrieved from the internet Nov. 3, 2022, https://www.croatiaweek.com/crolander-wooden-keyboards-from-croatia/.

Crolander, Wooden Keyboard—65% Keyboard—Resin Backlit—Solid Walnut Wood Keycaps Hot-Swap Switches, retrieved from the internet Sep. 30, 2022, https://www.etsy.com/dk-en/listing/1160853152/wooden-keyboard-65-keyboard-resin.

Crolander, Wooden Mechanical Keyboards—CroLander, retrieved from the internet Sep. 29, 2022, https://www.crolander.xyz/listing/1160846100/handmade-wooden-wireless-65-mechanical.

Enarion3D, Resin seems to expand when curing, retrieved from the internet Sep. 30, 2022, https://www.reddit.com/r/ElegooMars/comments/ebty7z/resin_seems_to_expand_when_curing/.

Framework, Framework Laptop Framework Laptop 13 DIY Edition (11th Gen Intel® Core™), retrieved from the Internet, https://frame.work/products/laptop-diy-11-gen-intel.

Fraunhofer-Gesellschaft, Eco-Computer with a natural wood look, Aug. 2, 2012, retrieved from the internet, https://phys.org/news/2012-08-eco-computer-natural-wood.html.

Freedman, A., Dell Hit With Fraud Case Over Alienware Area-51m Upgrade Claims, Jun. 4, 2021, retrieved from the Internet, https://www.tomshardware.com/news/dell-hit-with-fraud-case-over-alienware-area-51m-upgrade-claims.

Iameco, D4R Technical Specifications, retrieved from the internet Sep. 29, 2022, https://iameco.com/d4r-technical-specifications/.

Immonen, et al, Potential of Commercial Wood-Based Materials as PCB Substrate, Apr. 15, 2022, retrieved from the Internet, https://www.ncbi.nlm.nih.gov/pmc/articles/PMC9000880/.

Mistel, Mistel Doubleshot PBT Keycaps for Mechanical Keyboard with Cherry MX Switches and Clones, OEM Profile 108 Keys Plus Extra 11 Keys Set, PBT Keycaps with 6.25U Space Bar for PC Gaming Keyboard, Black, retrieved from the internet Sep. 30, 2022, https://www.amazon.com/Mistel-Doubleshot-Mechanical-Keyboard-Switches/dp/B08FWZCZGD?th=1.

MK Milling, Mk Milling Wood Keyboard Case Info, retrieved from the internet, Nov. 3, 2022, https://mkmilling.com/woodcase_html.

Null, C., Review: Volta V Gaming PC, Jul. 7, 2017, retrieved from the internet, https://www.wired.com/2017/07/review-volta-v-gaming-pc/.

Patel, P., Sustainable insulation material is made from wood, Cambridge Core, Apr. 4, 2018, accessed May 3, 2022, https://www.cambridge.org/core/journals/mrs-bulletin/news/sustainable-insulation-material-is-made-from-wood.

Spooky, Peruvian Company Creates Wooden Laptop Designed to Last Forever, Sep. 10, 2019, retrieved from the Internet Sep. 30, 2022, https://www.odditycentral.com/news/peruvian-company-creates-wooden-laptop-designed-to-last-forever.html.

Sydor, et al, Usability of wood-based materials as a supporting layer of PCB, Jan. 2010, retrieved from the internet, https://www.researchgate.net/profile/Maciej-Sydor/publication/255978784_Usability_of_wood-based_materials_as_a_supporting_layer_of_PCB/links/54a2a2020cf257a63604cd03/Usability-of-wood-based-materials-as-a-supporting-layer-of-PCB.pdf.

Vanwalleghem, L., I Made A Computer Out of Wood, retrieved from the internet Sep. 29, 2022, https://www.boredpanda.com/diy-wood-computer-louis-vanwalleghem/?utm_source=google&utm_medium=organic&utm_campaign=organic.

* cited by examiner anisotropic surface

Aluminum Alloy Surface

Wood Envelope

ABS#1 Plastic Envelope

VELOCITY RESULTS

Wood Pipe Velocity Graph

Wood Pipe VelocityGraph (Closer look to rough surface)

Aluminum Pipe Velocity Graph

Aluminum Pipe VelocityGraph (Closer look to rough surface)

Velocity Magnitudes Through Pipe Length

Wood Pipe

Aluminum Pipe

PORTABLE AUTONOMOUSLY POWERED COMPUTER WITH THERMALLY SEPARATED HEAT ENERGY SOURCES IN VORTICITY-INDUCING CAVITY

CROSS-REFERENCE TO RELATED APPLICATIONS

The subject matter of this application may have common inventorship with and/or may be related to the subject matter of the following:

U.S. Provisional Application Ser. No. 63/364,106, titled "Portable Autonomously Powered Computer with Thermally Separated Heat Energy Sources in Vorticity-Inducing Cavity," filed by Jason Braatz, on May 3, 2022.

This application incorporates the entire contents of the foregoing application herein by reference.

TECHNICAL FIELD

Various embodiments relate generally to systems and method to build modular mobile computing devices.

BACKGROUND

A mobile computing device (e.g., smartphones, tablets, and laptops, other handheld electronic devices) is a handheld device that users may use to perform various functions such as computing, communication, and entertainment on the go. These devices may include smartphones, tablets, and laptops. Typically, a mobile computer may include a compact design. For example, the mobile computer may be equipped with wireless connectivity, touchscreens, and built-in cameras.

In some cases, the increasing use of mobile computers may have raised concerns about their environmental impact. For example, some mobile computing devices may require significant amounts of energy to manufacture, operate, and dispose of, leading to significant greenhouse gas emissions and waste generation. In some examples, a production of these devices may involve usage of toxic chemicals and rare earth metals, which may have adverse effects on the environment. To address these concerns, various efforts are underway to make mobile computers more sustainable. For example, one approach is to develop more energy-efficient devices that consume less power and can be charged using renewable energy sources such as solar and wind power.

SUMMARY

Apparatus and associated methods relate to a passively cooling computing device (PCCD). For example, a PCCD may include a heat generating electronic component(s) including a processor and a memory. The PCCD may, for example, also include a passive cooling structure disposed between the HGECs and a cooling region of the computing device. For example, the passive cooling structure may include an anisotropic surface configured to passively induce air vorticity in response to a thermal gradient. The passive cooling structure may also include a microchannel substructure comprising tubules. For example, when heat energy is generated from the HGECs, the volume around the HGECs may be in fluid communication with the cooling region by convection generated by a pressure differential and air flow induced by the anisotropic surface texture. Various embodiments may advantageously provide a heat efficient portable computer device.

Apparatus and associated methods relate to a portable modulated computer having a thermally separated component design and surface features for passively cooling. In an illustrative example, a portable autonomously powered modular computer system (PAPMCS) may include a casing having an anisotropic surface. The anisotropic surface may, for example, induce turbulent air flow efficiently dissipate heat accumulating in the PAPMCS. In some implementations, the anisotropic surface may further include nano-tubular structure to direct heat from heat sources. For example, the PAPMCS may include breakout cables to thermally separate various breakout components of the PAPMCS. The breakaway components may, for example, be independently upgraded and/or replaced without, for example, changing a motherboard of the PAPMCS. Various embodiments may advantageously provide a sustainable and heat efficient portable computer device.

Various embodiments may, for example, advantageously provide an anisotropic surface texture having a roughness of Ra (um) 5.0-10.0 with an anisotropic sheer contour of a tangential, radial, or transversely cut angiosperm or gymnosperm material.

Various embodiments may, by way of example and not limitation, advantageously solve a need for modular portable computers (e.g., laptops) configured for passive airflow. For example, some embodiments may advantageously solve a problem of requiring additional and/or or specialized components (e.g., custom motherboards, custom heat pipes) to accommodate hot airflow.

Various embodiments may advantageously maintain recommended operation temperatures for components without applying excessively low temperatures (e.g., freezing such as with liquid nitrogen) of components such as CPUs. Such embodiments may, for example, advantageously provide cooling of components which may not operate properly at sub-zero temperatures (e.g., batteries). Some embodiments may, for example, advantageously enable CPU current to flow freely (e.g., at non-freezing temperatures) while (passively) maintaining thermal conditions. Some such embodiments may, for example, be configured to build a (passively cooled) quantum computer.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, to help introduce discussion of various embodiments, an exemplary portable autonomously powered modular computer system is introduced with reference to FIG. 1. Second, that introduction leads into a description with reference to FIGS. 2-4 of some exemplary embodiments of a heat dissipating envelope. Third, with reference to FIGS. 5-6, an exemplary breakout structure is described in application to an exemplary portable autonomously powered modular computer system. Fourth, with reference to FIG. 7, this document describes exemplary apparatus and methods useful for simulating and experimenting various models and materials for designing a heat dissipating envelope. Sixth, this disclosure turns to disclose exemplary implementations of the portable autonomously powered modular computer system. Fifth, to help introduce discussion of various embodiments, a renewable keyboard is introduced with reference to FIGS. 11-12. Sixth, that introduction leads into a description with reference to FIGS. 13-14 of some exemplary embodiments of materials for making renewable computing device applications. Seventh, with reference to FIGS. 15-16, a transparent wood is described in application to an exemplary renewable display. Eighth, with reference to FIGS. 17A-17C, this disclosure turns to a review of experimental data and a discussion of an exemplary wood laptop. Finally, the document discusses further embodiments, exemplary applications and aspects relating to additional features and advantageous of a portable autonomously powered modular computer system.

Figure 1:
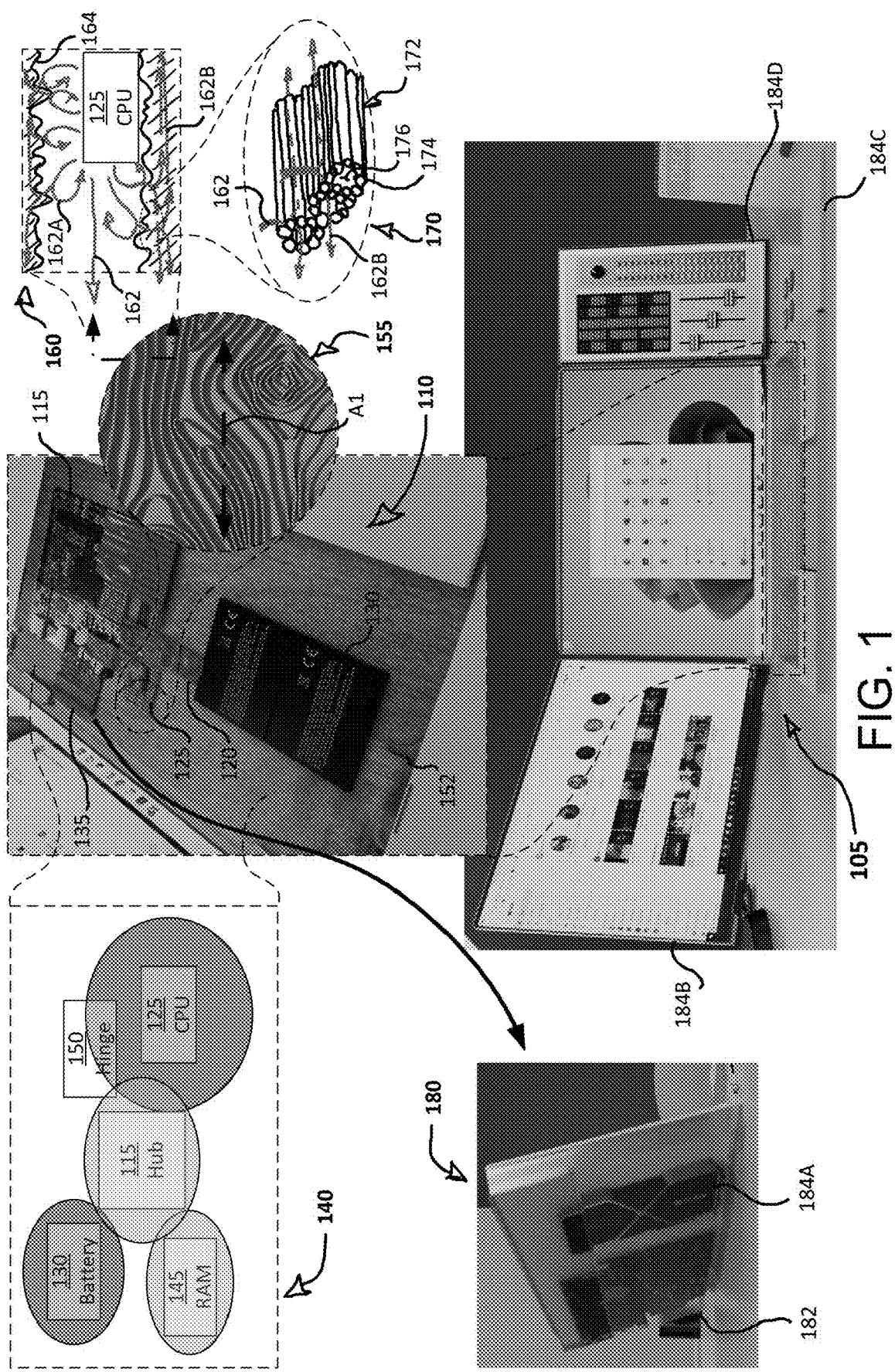
FIG. 1 depicts an exemplary portable autonomously powered modular computer system in an illustrative use-case scenario.

FIG. 1 depicts an exemplary portable autonomously powered modular computer system (PAPMCS 105) in an illustrative use-case scenario. An internal view 110 depicts illustrative components of the PAPMCS 105. In the depicted example, the PAPMCS 105 includes a connection hub 115 (e.g., a 'motherboard'). The connection hub 115 may, for example, be a standard ('off-the-shelf') motherboard, such as in a standard form factor. The connection hub 115 may, for example, be in an ITX form factors such as, by way of example and not limitation, Mini-ITX.

The connection hub 115 is connected to one or more components. In the depicted example, the connection hub 115 is connected to one or more physically remote (e.g., physically separated from the connection hub 115 and/or each other) components. As depicted, the connection hub 115 is coupled to a processor (a CPU 125, depicted with a heatsink) by a connector 120. The connection hub 115 is coupled to a battery 130 by a connector 120. Memory (e.g., RAM 145) may be coupled to the connection hub 115 by at least one connector 120 (in the depicted example, receiving modules for RAM are depicted, but the RAM modules are not shown). The connection hub 115 is depicted with a port 135 directly coupled to the connection hub 115 via a connector 120. The port 135 may, for example, be configured as an expansion port.

In various embodiments, one or more components (e.g., connector 120, CPU 125, battery 130, connection hub 115, port 135) may be 'off'-the-shelf components. For example, in some embodiments, the components may be standardly available without being adapted to a specific motherboard and/or manufacturer. In some implementations, the components may be specialized for a specific purpose (e.g., laptop, tablet). In some implementations, the components may be configured for a different purpose (e.g., server, desktop, IoT), but may be readily implemented in a portable (e.g., laptop, tablet) system. Accordingly, various embodiments may advantageously enable ready (e.g., inexpensive) replacement and/or repair of components and/or increase parts availability (e.g., by using standardized, widely available components). Interchangeable parts may, for example, advantageously increase longevity of the PAPMCS 105 (e.g., by allowing ongoing upgrades, reducing obsoletion due to model-specific parts such as a motherboard).

In some implementations, the connector 120 may, for example, be an unmodulated connection. For example, the connector 120 may be a direct coupling (e.g., electrical) between two components (e.g., the connection hub 115 and another component such as the CPU 125). As an illustrative example, the connector 120 may be a multi-conduit cable (e.g., ribbon cable) having corresponding ends configured to couple to the two components. For example, the connector 120 may have corresponding pluggable ends (e.g., male and female, respectively) configured to pluggably couple the component(s) in communication with each other (e.g., powered communication, data communication, electrical communication, optical communication). In some implementations, by way of example and not limitation, an unmodulated connection (e.g., direct coupling, such as by copper wires) of the components may allow substantially 'native' performance (e.g., speed, power transfer, voltage drops) relative to coupling the component directly to the connection hub 115.

Such embodiments may, for example, advantageously allow thermal distancing (e.g., separation, isolation) of heat-producing components. Accordingly, various embodiments may advantageously reduce thermal dissipation requirements by spreading heat dissipation across a larger area and/or reducing thermal burden overlap between multiple heat-producing components. Some embodiments may, for example, advantageously allow placement of a component inside an at least partial envelope having an anisotropic surface. Thermal distancing and/or isolation may, for example, advantageously enable the PAPMCS 105 to be repaired, serviced, and/or upgraded without requiring interaction with specialized cooling components (e.g., heat tubes, specialty fans). Reduction of local thermal dissipation requirements may, for example, advantageously enable passive cooling (e.g., fan-less cooling, water-less cooling).

Placement of components within a case of the PAPMCS 105, such as shown in the internal view 110, may be determined, by way of example and not limitation, using a collapsed field analysis. For example, during a design process, thermal attributes of one or more components may be determined. Thermal attributes may, for example, include manufacturer specifications for acceptable operating temperature ranges. Thermal attributes may, for example, include expected (e.g., tested, projected, manufacturer-provided) thermal load characteristics (e.g., heat generated). Based on the components involved and the corresponding thermal attributes, a component arrangement 140 may, for example, be generated. For example, the thermal attributes may be stored in data structures (e.g., metadata) corresponding to data objects corresponding to each component. As an illustrative example, a placement engine (not shown) may operate to rank heat sources (e.g., highest to lowest) in the components based on the thermal attributes. A placement pattern may, for example, be generated such that components are placed to maximize distance (e.g., within a predetermined placement boundary such as defined by an acceptable computer case size) between the most exuberant heat sources (e.g., according to ranking). In some implementations, thermal attributes may, for example, include thermal sensitivity (e.g., performance and/or longevity impact in response to excess thermal energy). The placement pattern may, for example, be generated such that heat sensitive components are placed away from high-thermal load components.

For example, a placement engine may (automatically) generate a placement pattern having component placement coordinates (e.g., based on physical and/or thermal envelopes). The placement engine may, for example, generate a placement pattern with component coordinates such that an equation 1 is satisfied:

$$\text{MAX}(T_{intersect}) \leq \text{MIN}(T\text{Max}_i \text{ for } i=1 \text{ to } N), \quad \text{EQUATION 1:}$$

where $\text{MAX}(T_{intersect})$ is a maximum temperature at an intersection of dissipation regions of the components, $\text{MIN}(\ldots)$ is a minimum, and $T\text{Max}_i$ is a maximum acceptable operating temperature for a component i of N components being placed, the ith component(s) having the lowest TMax of the N components.

In the depicted example, the CPU 125 and the battery 130 may, as depicted, are the highest thermal loads. Accordingly, a distance of separation within the component arrangement 140 (e.g., bounded by the available case dimensions) may be highest (e.g., maximized). The connection hub 115 (labeled as "hub") may be placed between them as having a lower thermal load and/or low thermal sensitivity. The RAM 145 may be placed close to the connection hub 115 (e.g., due to the lower load), but physically separated (e.g., substantially thermally isolated) from the CPU 125 and the battery 130. For example, the RAM 145 may have a relatively lower thermal load (depicted by the 'yellow' color instead of the 'red' color) but may have a high thermal sensitivity. A hinge 150 may, for example, be (substantially) thermally neutral (e.g., not affected by an expected temperature range of the CPU 125, not generating a significant and/or measurable amount of heat) and so, in this example, the CPU 125 is placed adjacent the hinge 150. The components may, for example, be (directly) connected by the connectors 120 (e.g., to the connection hub 115). Accordingly, thermal distancing may reduce a localized heat dissipation burden, such as relative to a traditional laptop configuration in which the CPU 125 and the battery 130 thermal dissipation zones are overlapping and additive, and additive to the connection hub 115 and the RAM 145 thermal dissipation zones.

Furthermore, in the depicted example, the PAPMCS 105 is provided with an anisotropic surface having a multi-axial distribution in surface texture. As depicted, a case 152 is made of organic (e.g., plant-based) material. The organic material may, for example, be an angiosperm and/or gymnosperm plant material(s), such as wood from an angiosperm or gymnosperm tree. A surface of the case 152 is provided with an anisotropic surface texture 155. As depicted, the anisotropic surface texture 155 has a first distribution along a 'grain' axis µl, and a second distribution along a 'cross-grain' axis (not shown) transverse to µl.

As shown in cross-section 160, the anisotropic surface texture 155 of the case 152 is configured to provide a vorticity-inducing envelope around one or more components. As depicted in the cross-section 160, the CPU 125 is bounded on at least two sides by an envelope material 164 (e.g., wood) making up the case 152 and having the anisotropic surface texture 155. Heat from the CPU 125 induces (micro) air currents 162 (e.g., due to increased molecular interaction, pressure increases) away from the CPU 125. When the air currents 162 encounter the anisotropic surface texture 155 of the envelope material 164, voracity of the air currents 162 is induced, creating an eddy current 162A. The eddy current 162A brings cooler air back towards the CPU 125. Accordingly, heat is dissipated from the CPU 125 and the CPU 125 is (passively) cooled by turbulence induced by the anisotropic surface texture 155 envelope material 164.

In the depicted example, the envelope material 164 is provided with a microchannel substructure 170 (e.g., nanostructure). The microchannel substructure may, for example, be configured as disclosed at least with reference to Appendix E. As depicted, the envelope material 164 is made up of microtubes 172 (e.g., xylem structure). Each microtubes 172 is formed of individual tubules 174 (e.g., solid, hollow). Together, the individual tubules 174 form a wall defining a lumen 176 of the microtubes 172. The wall formed by the individual tubules 174 may, for example, be permeable. For example, the wall may be permeable when a pressure differential (e.g., above a pressure difference threshold) exists between the lumen 176 and the external environment.

Air currents 162 may, for example, be at an elevated temperature (e.g., from the CPU 125). Accordingly, the hotter air currents 162 may be at an elevated pressure relative to surrounding air. Accordingly, the hotter air currents 162 may pass through the wall of the microtubes 172 between the individual tubules 174 and enter the lumen 176. Once in the lumen 176, the warmer air may follow a path of least resistance as a flow 162B (e g, laminar flow) and be transported along the lumen 176 away from the CPU 125. Accordingly, higher temperature air may advantageously be transported away from the CPU 125 by the substructure of the envelope material 164 (e.g., for dissipation). Such embodiments may, for example, advantageously enable passive cooling. For example, such implementations may reduce or eliminate a need for specialized cooling equipment (e.g., fans, heat pipes).

In some embodiments, thermal separation may, for example, be increased by creating a cavity in the envelope material 164 (e.g., a pocket in a wood case) for a thermal generator(s) (e.g., CPU 125, battery 130) to be disposed in (e.g., at least partially). The cavity may advantageously increase a thermal separation/isolation from other components. Accordingly, the cavity may advantageously reduce a footprint required (e.g., of the component arrangement 140) while achieving a desired thermal dissipation profile. In some embodiments, the cavity may be configured to have a size and/or access to air (e.g., an open channel(s) to an exterior such as a rear of the PAPMCS 105) such that sufficient (cool) air is available to dissipate a predicted thermal energy level associated with the component(s).

In some implementations, the direct connection may advantageously enable rapid (e.g., 'instant') pluggable upgrade(s) and/or modules directly connected to a connection hub 115 (e.g., a 'Northbridge' type connection) and/or other components without requiring replacement of a specialized motherboard. For example, some implementations may advantageously enable external component upgrades and/or modules to be pluggably connected without requiring a special interface/intermediary component to modulate and/or demodulate signals (e.g., without a USB controller/hub) between the two components being connected.

For example, as depicted in an external upgrade configuration 180, the port 135 may be configured to receive components external to the PAPMCS 105. As depicted, an external receptacle 182 (e.g., a 'pocket') is configured to receive a pluggable component 184A. In the depicted example in the external upgrade configuration 180, the pluggable component 184A is a graphics card. For example, a user may wish to (temporarily) use a high-powered (e.g., desktop grade) graphics card when performing modeling and/or rendering tasks, without replacing their computer or opening the case. Accordingly, for example, a user may advantageously pluggably connect a standard 'off'-the-shelf graphics card as a pluggable component 184A directly to the PAPMCS 105 (e.g., to the connection hub 115), such as by the port 135. A controller (e.g., automatic detection and control, manual switch) may, for example, be configured to disconnect an existing related component (e.g., internal graphics card) in favor of the external graphics card. When the external graphics card is unplugged, for example, the internal graphics card, in this illustrative example, may be reconnected (e.g., by operating a manual and/or automatic switch).

Furthermore, as depicted, add-on modules may be added and/or removed (e.g., pluggably). The PAPMCS 105 is coupled to an external monitor 184B (e.g., directly to the connection hub 115 and/or battery 130, such as using a connector 120 configured as an internal video cable). The PAPMCS 105, as depicted, is coupled to an input/output device 184C and a touchscreen control interface 184D (e.g., audio mixer). Such modules may, for example, be directly coupled to the connection hub 115 via (direct) connections such as shown with the port 135. Accordingly, various embodiments may allow dynamic configuration of the PAPMCS 105 for a current use and/or application without opening the case. In some embodiments, one or more add-on modules may be specially configured. In some implementations, one or more add-on modules may be 'off-the-shelf' components having connections configured to be internally integrated (e.g., internal to a case). The add-on-modules may, for example, provide a case and a coupler configured to directly couple externally to the PAPMCS 105.

In various implementations, the PAPMCS 105 may include heat generating electronic components (e.g., the CPU 125, the RAM 145). For example, the PAPMCS 105 may include the case 152 disposed between the heat generating electronic components and a cooling region. For example, the case 152 may be configured to induce thermal energy flow out of a volume around each of the heat generating electronic components. For example, the case 152 may include the anisotropic surface texture 155 configured to passively induce air vorticity in response to a thermal gradient. For example, the case 152 may include the microchannel substructure 170. The microchannel substructure 170 may include the individual tubules 174. For example, each of the tubules defines the lumen 176 extending away from the heat generating electronic components. For example, the wall of the individual tubules 174 may be permeable in response to a thermal-gradient induced pressure differential.

For example, when heat energy is generated from the heat generating electronic components, the volume around the heat generating electronic components may be in fluid communication with the cooling region by convection generated by a pressure differential and air flow induced by the anisotropic surface texture. For example, the thermal energy at the volume may also be dissipated via radiation and reflection.

For example, the heat generating electronic components further may include a power regulation circuit (e.g., a power supply, the battery 130, a pulse width modulation circuit). For example, the heat generating electronic components may include a digital display device. For example, the digital display device may include a wood circuit board disposed behind a transparent and lignin-modified wooden display layer.

For example, the case 152 may bound each of the heat generating electronic components such that the case 152 defines a totally enclosed envelop around each of the heat generating electronic components. For example, the microchannel substructure 170 may be exposed at an outer surface of the computing device. For example, the PAPMCS 105 may not include a cooling fan.

Figure 2:
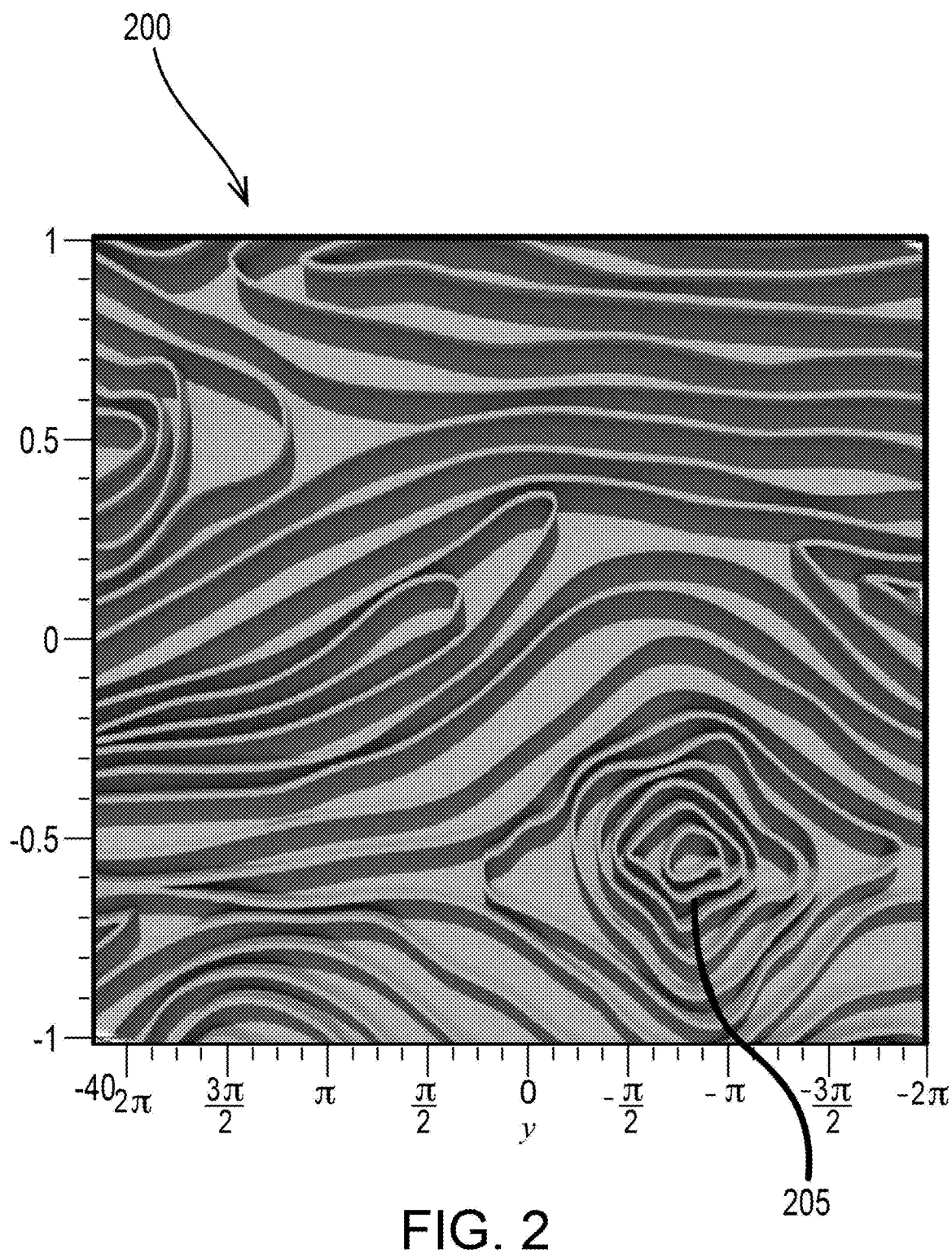
FIG. 2 depicts an exemplary surface model of a heat dissipating surface.

FIG. 2 depicts an exemplary surface model of a heat dissipating surface (HDS 200). For example, the HDS 200 may be used as a casing for the PAPMCS 105 (e.g., as disclosed at least with reference to anisotropic surface texture 155 of FIG. 1). For example, the HDS 200 may be a combination of an angiosperm surface and a cambial surface. For example, the HDS 200 may be 50% probable angiosperm and a 50% probable gymnosperm. As shown, the HDS 200 includes rings 205. In some implementations, the rings 205 may create a heat inducing channel inducing a turbulent flow envelope so that quick dissipation of heat energy may be induced.

Figure 3A:
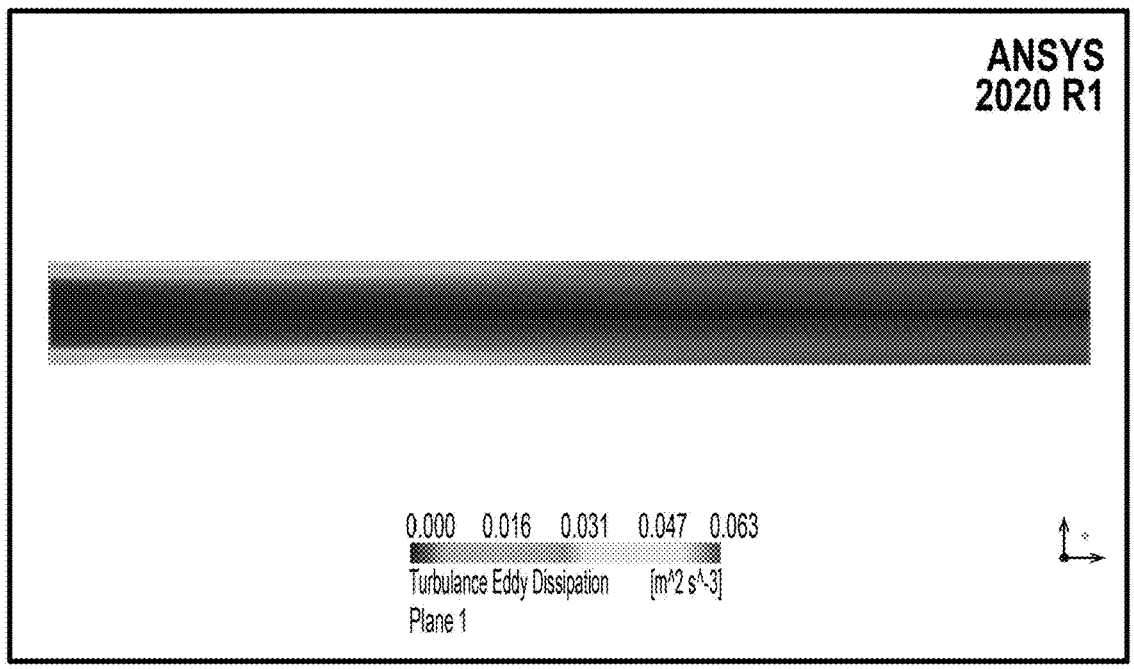
FIG. 3A depicts exemplary experimental result of eddy velocity diagrams of aluminum alloy surface and an anisotropic surface.
Figure 3A:
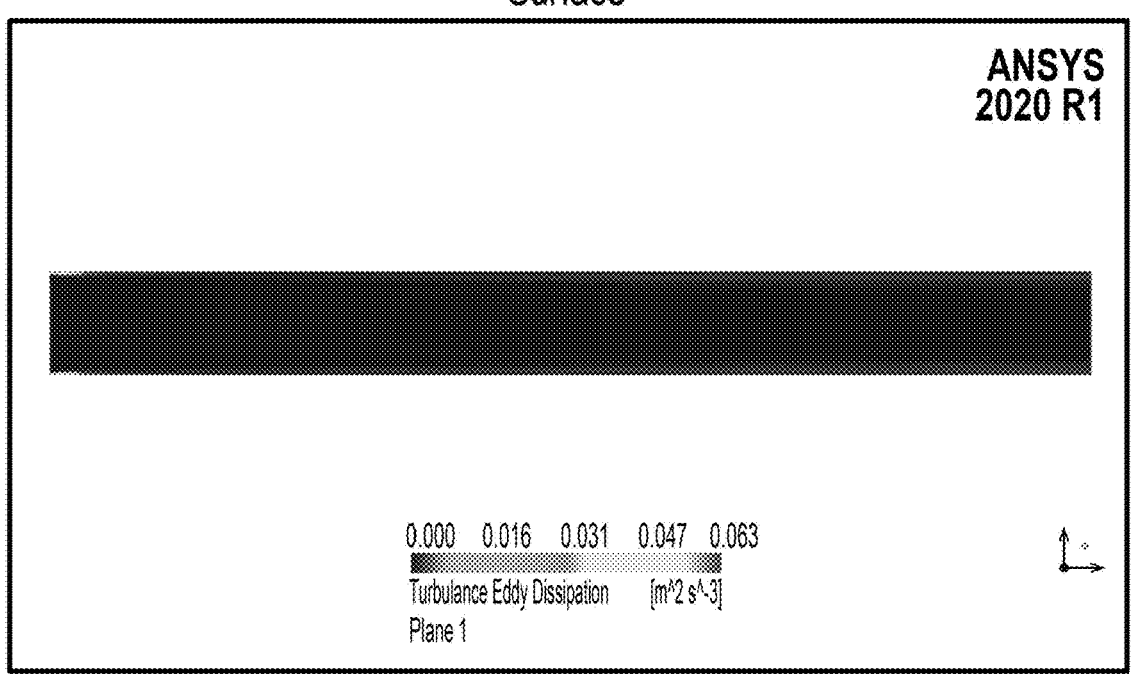
Figure 3B:
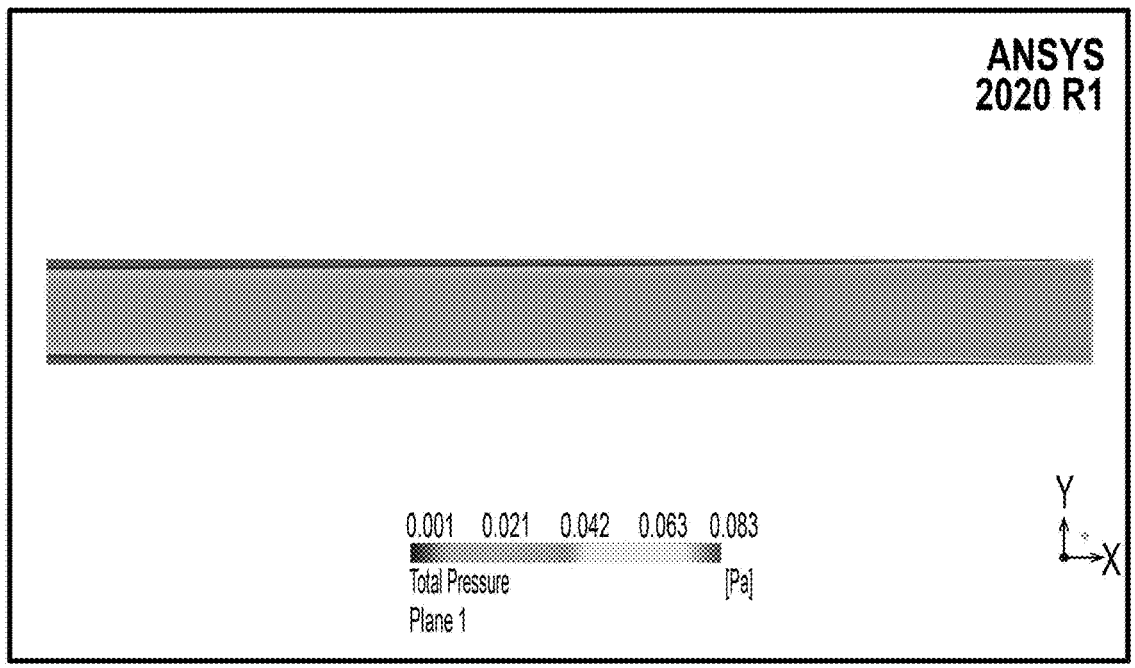
FIG. 3B depicts exemplary experimental result of pressure contour diagrams an isotropic plastic surface and a wood surface.
Figure 3B:
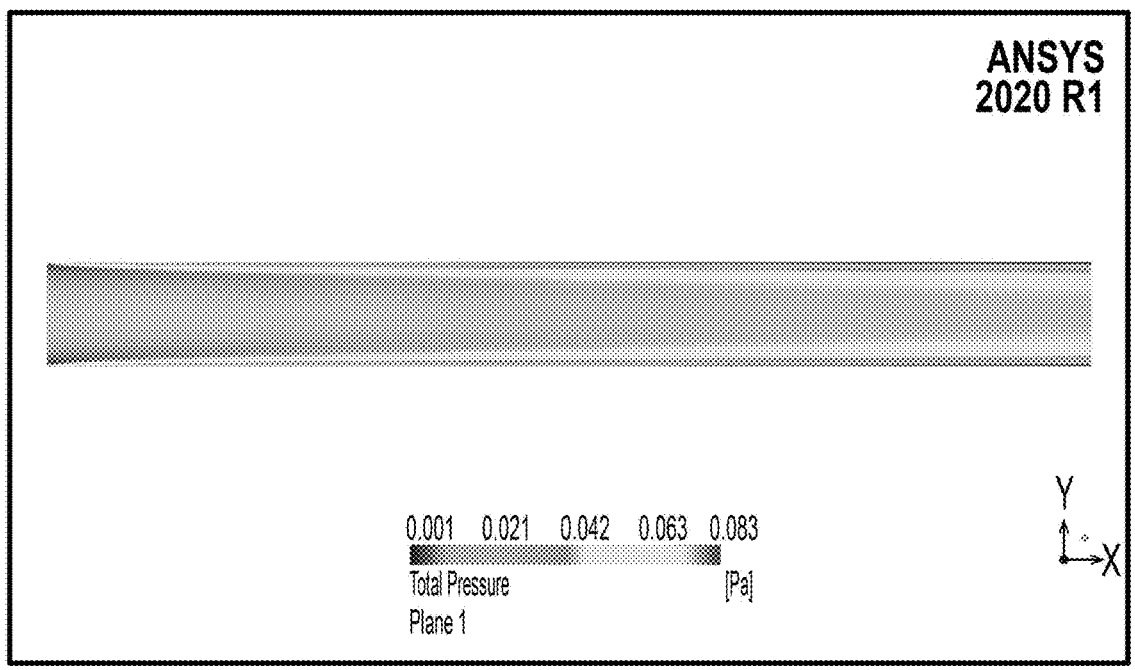
Figure 3C:
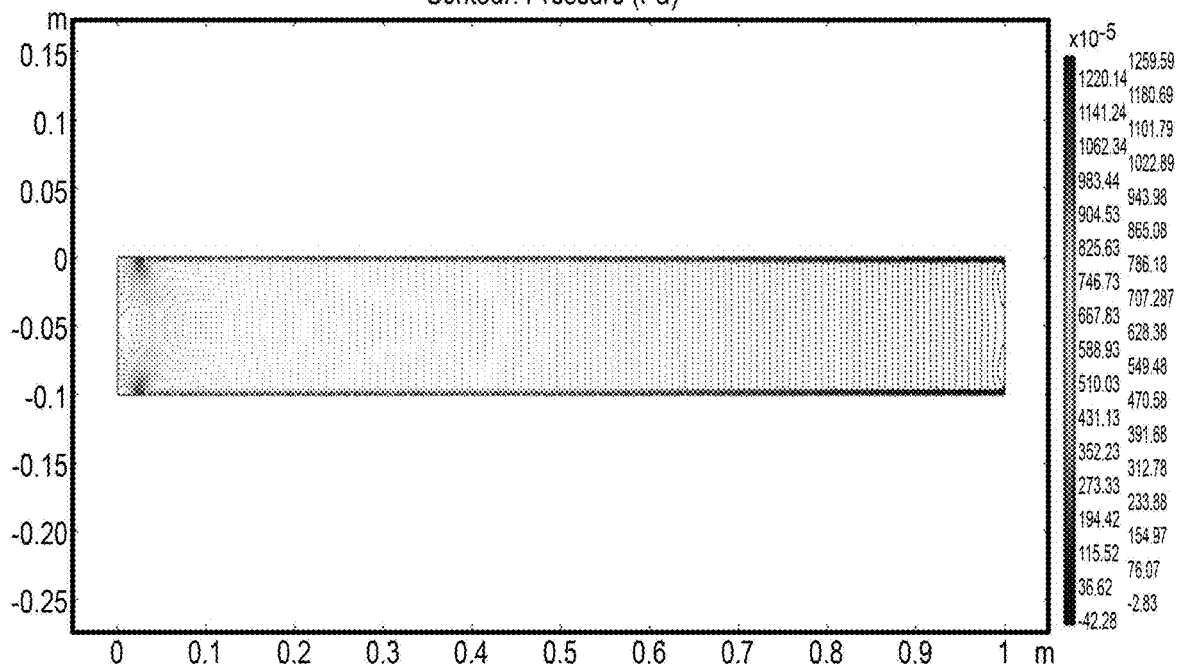
FIG. 3C, FIG. 3D, FIG. 3E, FIG. 3F, FIG. 3G, and FIG. 3H depict exemplary experimental results of thermal dynamic behaviors of wood, aluminum, and plastic surfaces.
Figure 3C:
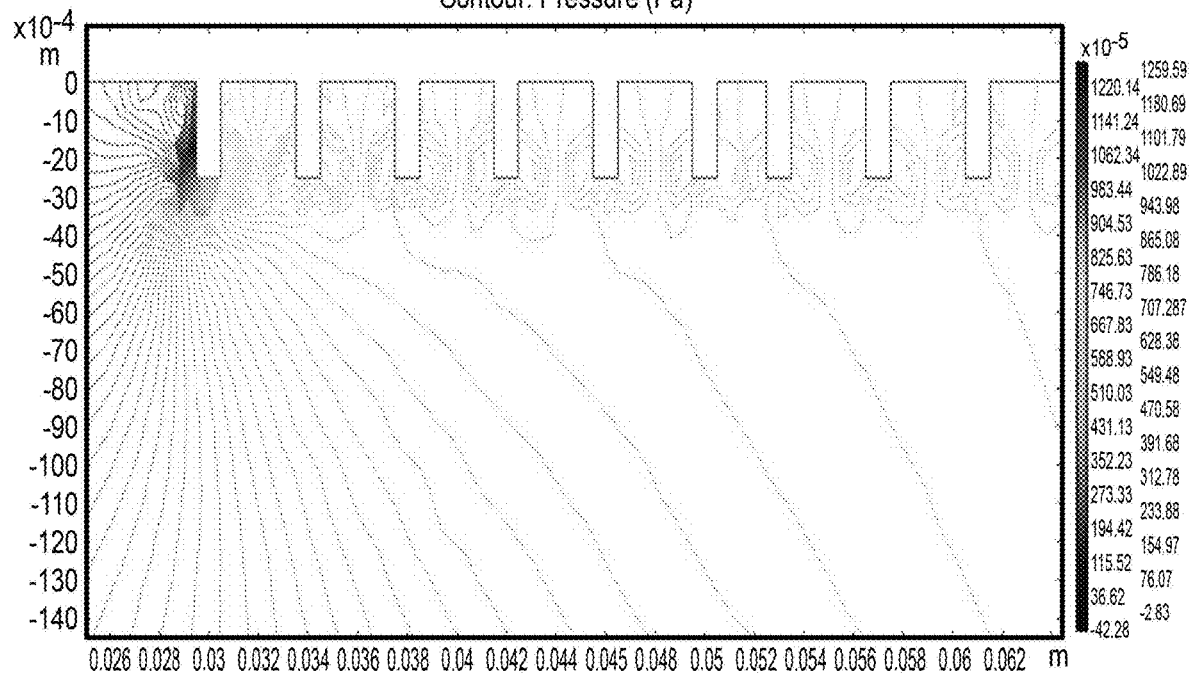
Figure 3D:
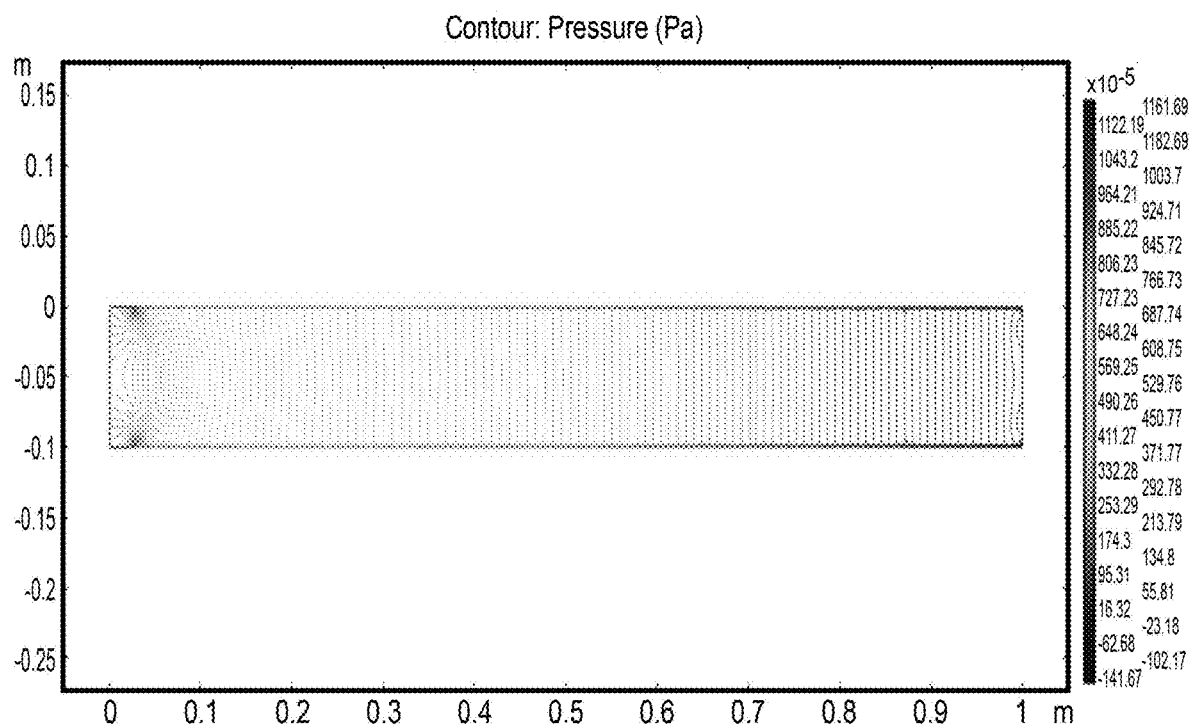
Figure 3D:
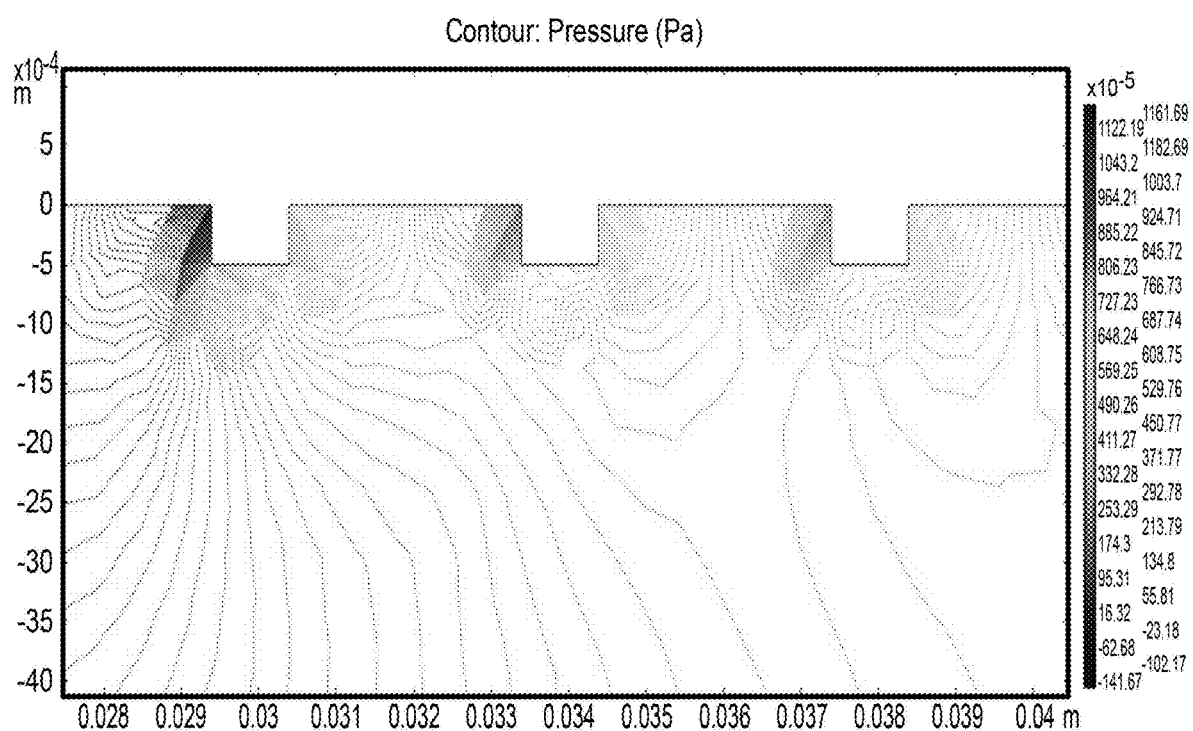
Figure 3E:
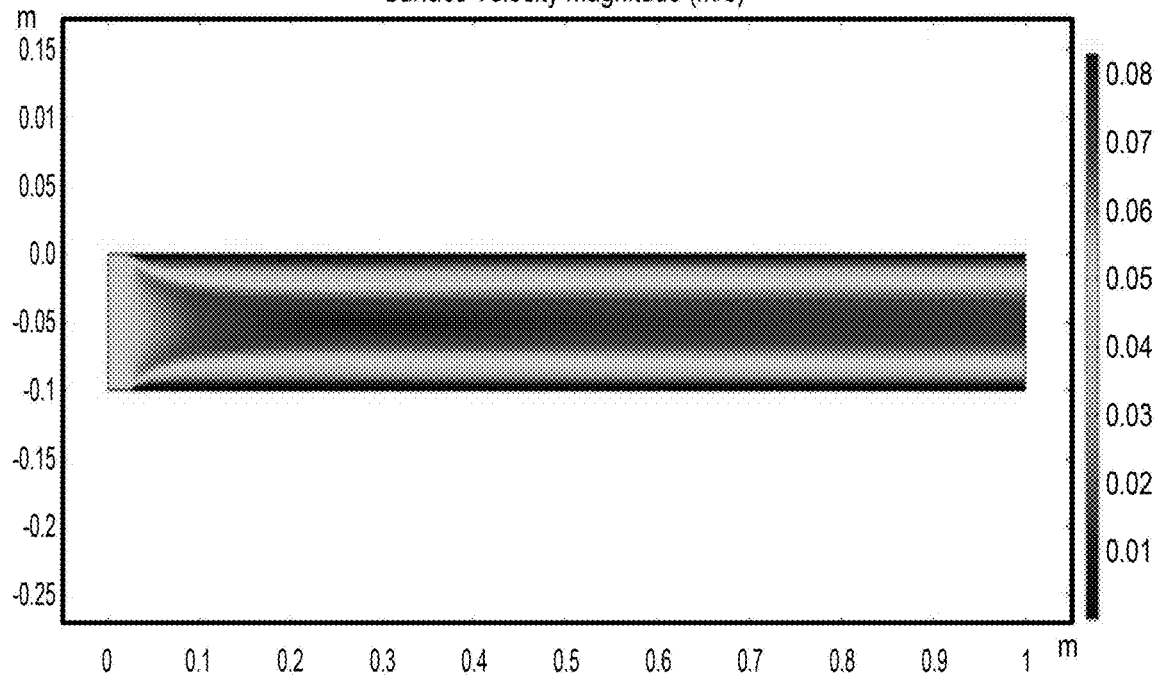
Figure 3E:
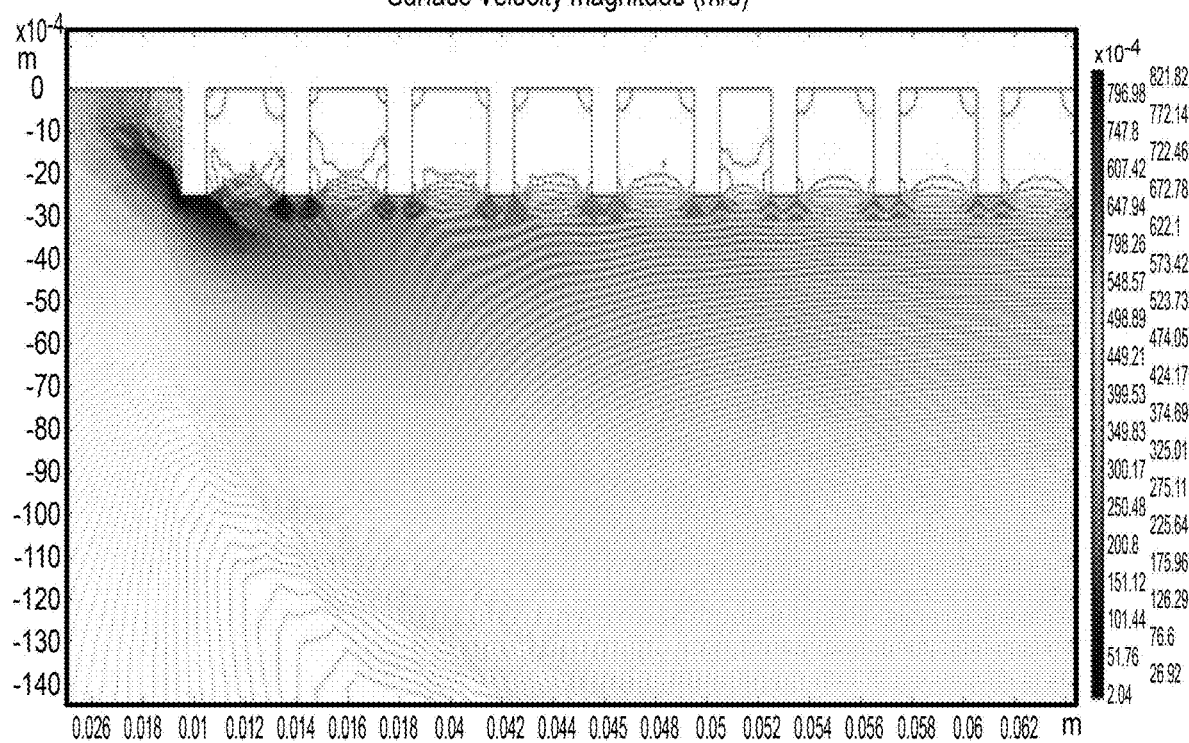
Figure 3F:
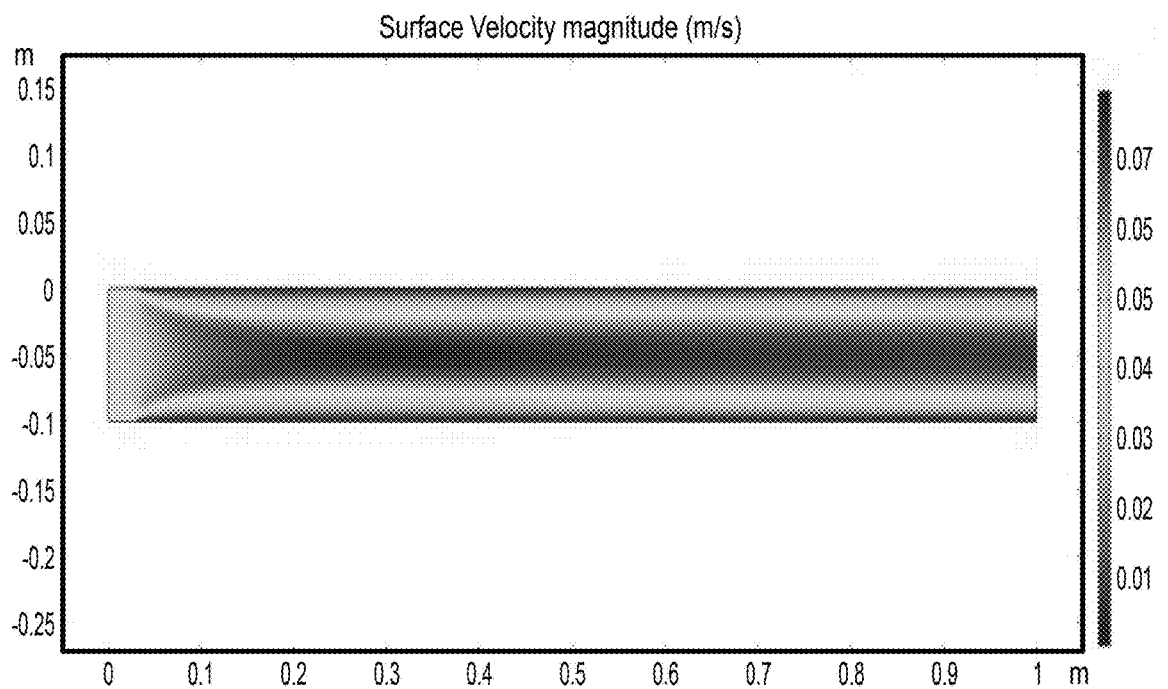
Figure 3F:
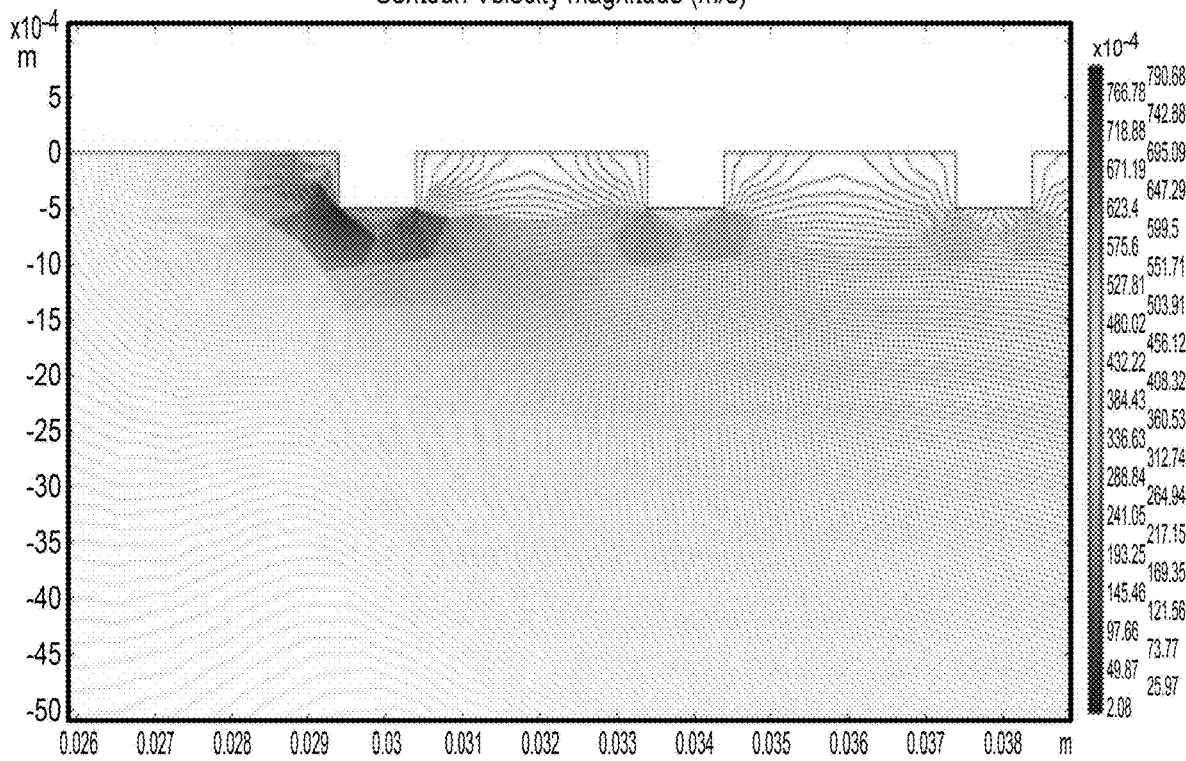
Figure 3G:
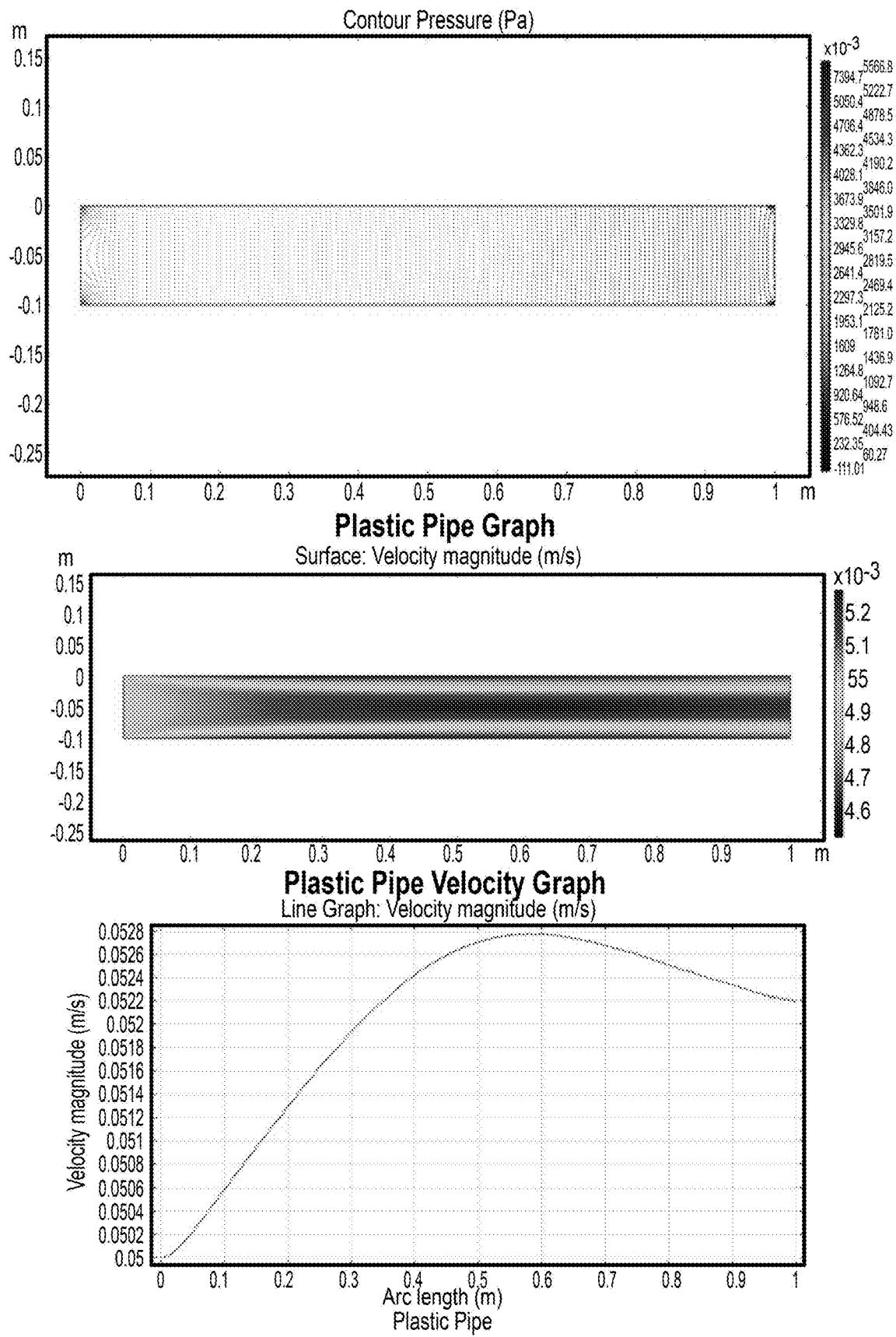
Figure 3H:
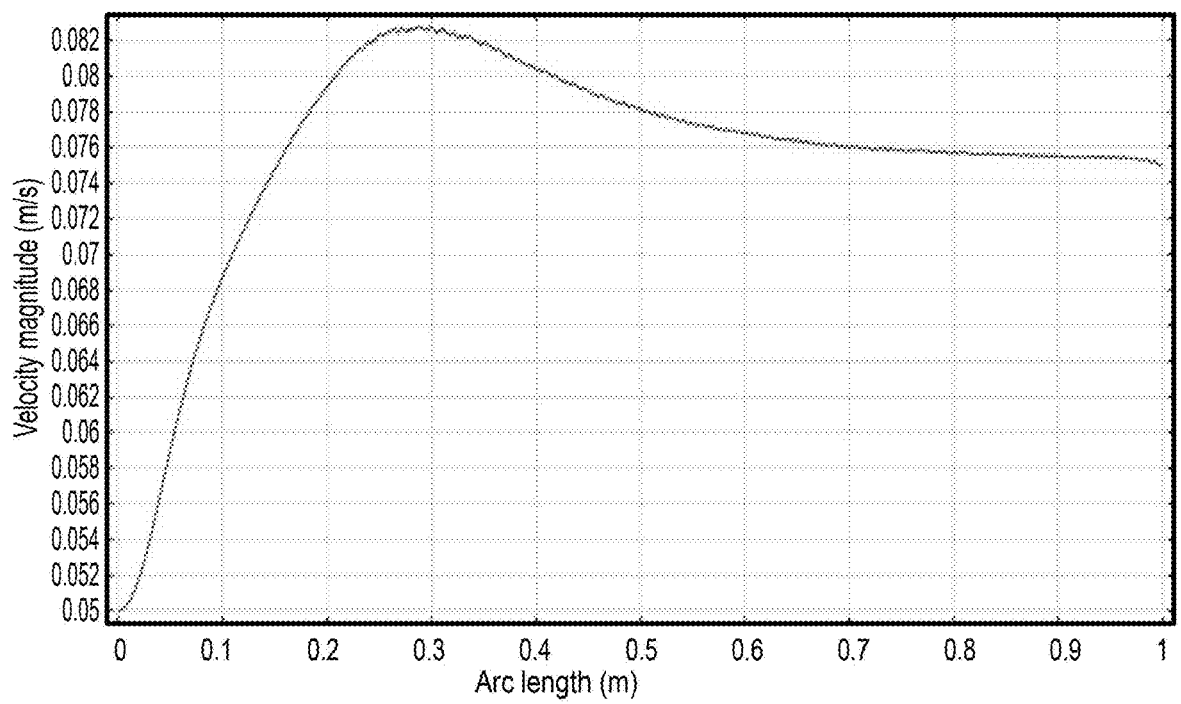
Figure 3H:
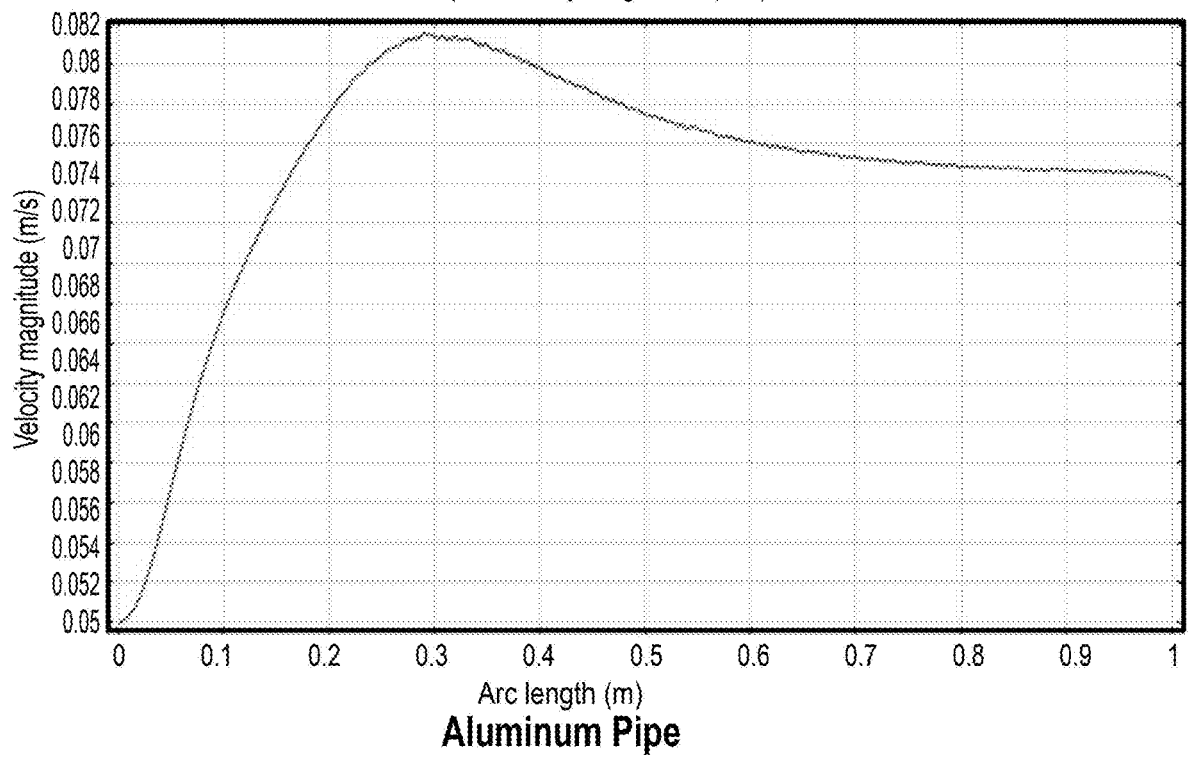

FIG. 3A depicts exemplary experimental results of eddy velocity diagrams of an aluminum alloy surface and an anisotropic surface (e.g., the HDS 200). FIG. 3B depicts exemplary experimental result of pressure contour diagrams of an isotropic plastic surface and a wood surface (e.g., the HDS 200). For example, the alloy aluminum surface may be an axial and linearly machined Aluminum 6061. In this example, no active pressure is introduced. The graph at the top is a chamber with the anisotropic surface and the chamber at the bottom is a chamber with the aluminum alloy surface.

Referring to FIG. 3A, both graphs show an envelope simulation. As shown, the angiosperm/gymnosperm anisotropic surface contour may, for example, provide a superior heat dissipation property to the aluminum alloy surface in maintaining entrant turbulent flows into a throughway envelope. In the top graph, the anisotropic surface envelope recycles turbulence flow with anisotropic contour of the anisotropic surface. In the bottom graph, in the aluminum alloy surface envelope, the entrant turbulent flows reassert back to a laminar flow almost instantly.

Referring to FIG. 3B, the experiment is performed using a throughway envelope similar to a natural wood surface. As an illustrative example, the average roughness of wood products as measured in (Ra) may be calculated as $$Ra = \frac{1}{l_r} \int_0^{l_r} |z(x)| dx$$

For example, Ra values across wood and wood composite specimens (untreated, milled wood without being further sanded, varnished, and/or kilned) is between 1.8-9.9. Pine, one of the most prolific conifers (gymnosperms) grown worldwide, may have anisotropic roughness both with-grain and against-grain with Ra scale at around 2.9.

In some implementations, higher roughness may provide better heat dissipation by enhancing turbulence flows. In some examples, an effectiveness of a thermodynamic system may be measured in gas pressure. For example, hotter gasses may expand and begin a self-perpetuating cycle of compressing and heating the gas molecules around it. Cooler gasses may do the opposite, for example.

In this example, results are simulated using a throughway envelope of our synthetic contour at an Ra scale of 2.9 (e.g., a pine wood envelope), versus an unworn ABS #1 plastic (e.g., non-TECARAN(R) Acrylonitrile Butadiene Styrene) which may have Ra of 0.01. As an illustrative example, a hot airflow is introduced from the left of the envelope, moving from 72 degrees (F.) to 110 degrees (F.). For example, this may simulate conditions when resistors, batteries, MOSFets, and/or other electronic components that may, in some examples, contribute to a rising temperature to the air mass.

Referring to FIG. 3B, the top graph is a simulation result of a wood surface envelop pressure contour. The bottom graph is a simulation result of a plastic surface of near perfect isotropic contour. As shown, in the wood surface scenario (top graph), air includes a mix of turbulence flow and laminar flows on entry. As heat is moving towards the material (the envelope), the turbulence flow continues to get introduced with the cooler gas from surrounding. As such, a re-enforcing act is introduced: as new "warm air" is added, the cooler air is further introduced by the turbulence flow again. Accordingly, the wood surface envelop may advantageously cool the entering hot air passively.

On the other hand, the isotropic plastic surface with a much lower Ra may diminish any pre-existing turbulence flow, allowing laminar flows to overtake. Since the laminar flows are much faster than the turbulent flow, for example, the isotropic plastic surface envelop may increase in pressure as the laminar flow is moving towards the center and outward. As that process induces even more heat, the laminar flow may induce hot air to escape to the other end of the envelope. In some examples, adjacent gas molecules within the laminar flow path may be heat up along the way. Therefore, heats may, for example, build up, diminishing cooling effect of the envelop. In some implementations, an envelope of anisotropic surface may advantageously induce cooling effect without a pressure-creating device (such as a fan). Accordingly, the PAPMCS 105 using the envelope of anisotropic surface may have passive cooling properties without pressure-creative device.

In various embodiments, by way of example and not limitation, a thermal envelope may be built with an Ra in um of a minimum of 2.0. In some embodiments, by way of example and not limitation, Ra of a thermal envelope may be between 5.0-10.0. Within this range, by way of example and not limitation, each Ra may, for example, be measurable but insignificant. An Ra over 12.0 (e.g., quite rough) may not afford smaller entrant turbulent flows and so may, for example, lower the overall air pressure, which may be undesirable for electronics. Accordingly, some embodiments may have a Ra less than 12.0.

FIG. 3C, FIG. 3D, FIG. 3E, FIG. 3F, FIG. 3G, and FIG. 3H depict exemplary experimental results of thermal dynamic behaviors of wood, aluminum, and plastic surfaces. In this example, multiphysics software (e.g., multiphysics software available from Ansys, Inc., Canonsburg, Pennsylvania) is used to model pipe materials of wood, aluminum, and plastic surfaces with same boundary conditions. As an illustrative example, one may classify wood as a highly rough surface, aluminum as a slightly rough surface, and plastic as having a perfectly smooth surface.

In this example, 0.05 m/s as air inlet velocity is introduced. Pipe length is 1 m and pipe diameter is 10 cm for each analysis. As shown in the results, for example, when inlet air velocity is hold substantially constant for each analysis, air flow may accelerate and become turbulent on the anisotropic surfaces compared to smooth surfaces which is mostly stable. Accordingly, in some implementations, the PAPMCS 105 using may use a wood surface to advantageously induce turbulent flow to facilitate heat dissipation for, at least, some of the heat intensive components.

Figure 4:
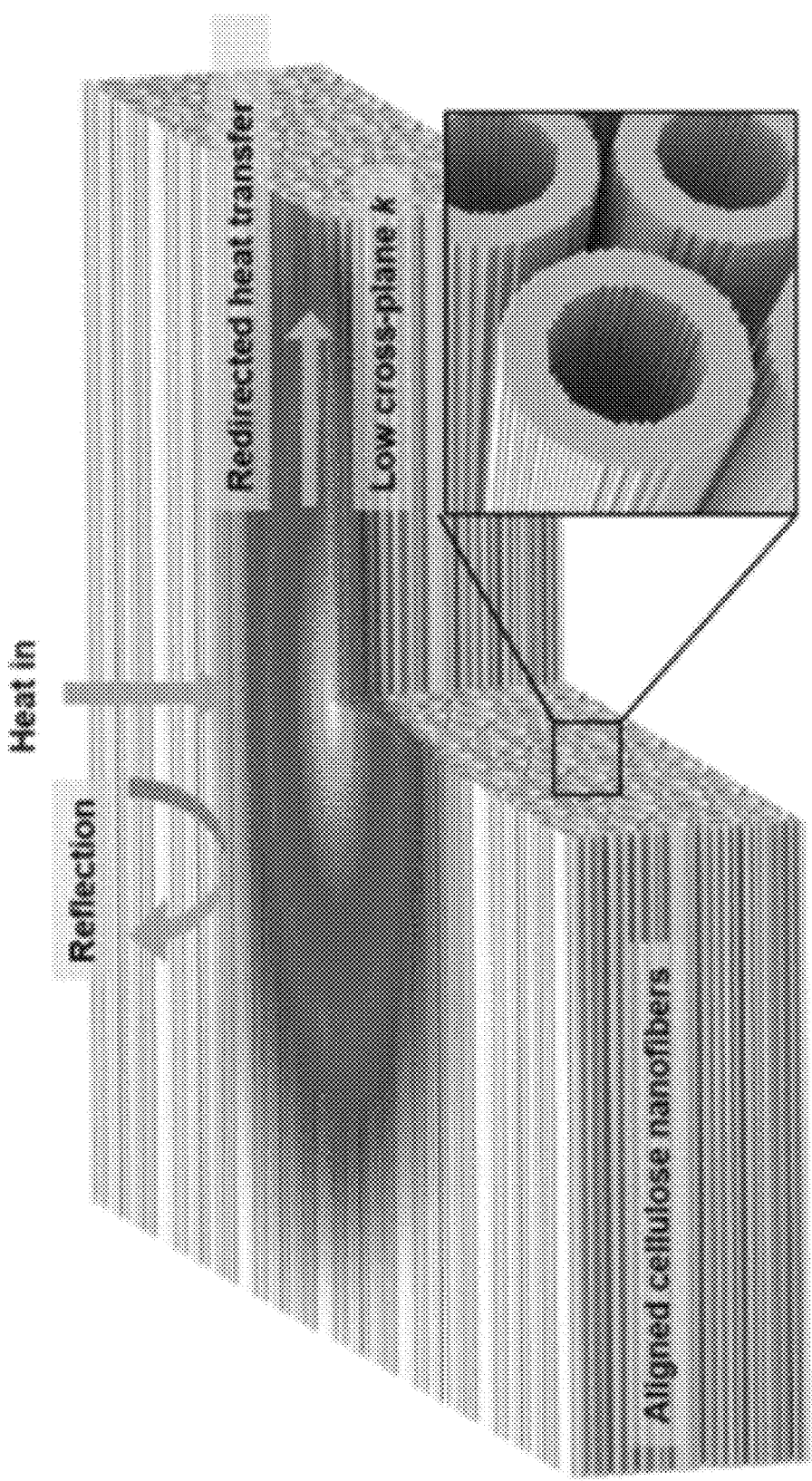
FIG. 4 depicts an exemplary nano-tubular structure of a heat dissipating surface.

FIG. 4 depicts an exemplary nano-tubular structure of a heat dissipating surface. For example, some natural wood may include the nano-tubular structure. As shown, the heat dissipating surface includes aligned cellulose nanofibers. When heat is introduced, the aligned cellulose nanofibers may, for example, transfer the heat energy to other parts of the surface. In various implementations, using the heat dissipating surface with the nano-tubular structure as casing, the PAPMCS 105 may enhance heat dissipation in, for example, a modular laptop computer.

Figure 5:
FIG. 5 shows an exemplary close-up view of the internal view of a thermally separated computer (e.g., the PAPMCS)

FIG. 5 shows an exemplary close-up view of the internal view 110 of the PAPMCS 105. In this example, the PAPMCS 105 includes breakout components (the connection hub 115, the battery 130, and the CPU 125) connected by connectors 120 (e.g., breakout cables). For example, the breakout cables may allow various components (e.g., 125, 130) to be mounted separately from the connection hub 115. In some implementations, the breakout components may advantageously be independently upgraded and/or replaced. In some implementations, the breakout components (e.g., the CPU 125) may be advantageously cooled independently away from other heat source. In some examples, using the HDS 200, the PAPMCS 105 may allow passive cooling of the breakout components so that performance may be advantageously enhanced. In various implementations, some heat sensitive components of the breakout components (e.g., the CPU 125) may be installed in pockets of the HDS 200 so that the heat may efficiently dissipated via the HDS 200.

Figure 6:
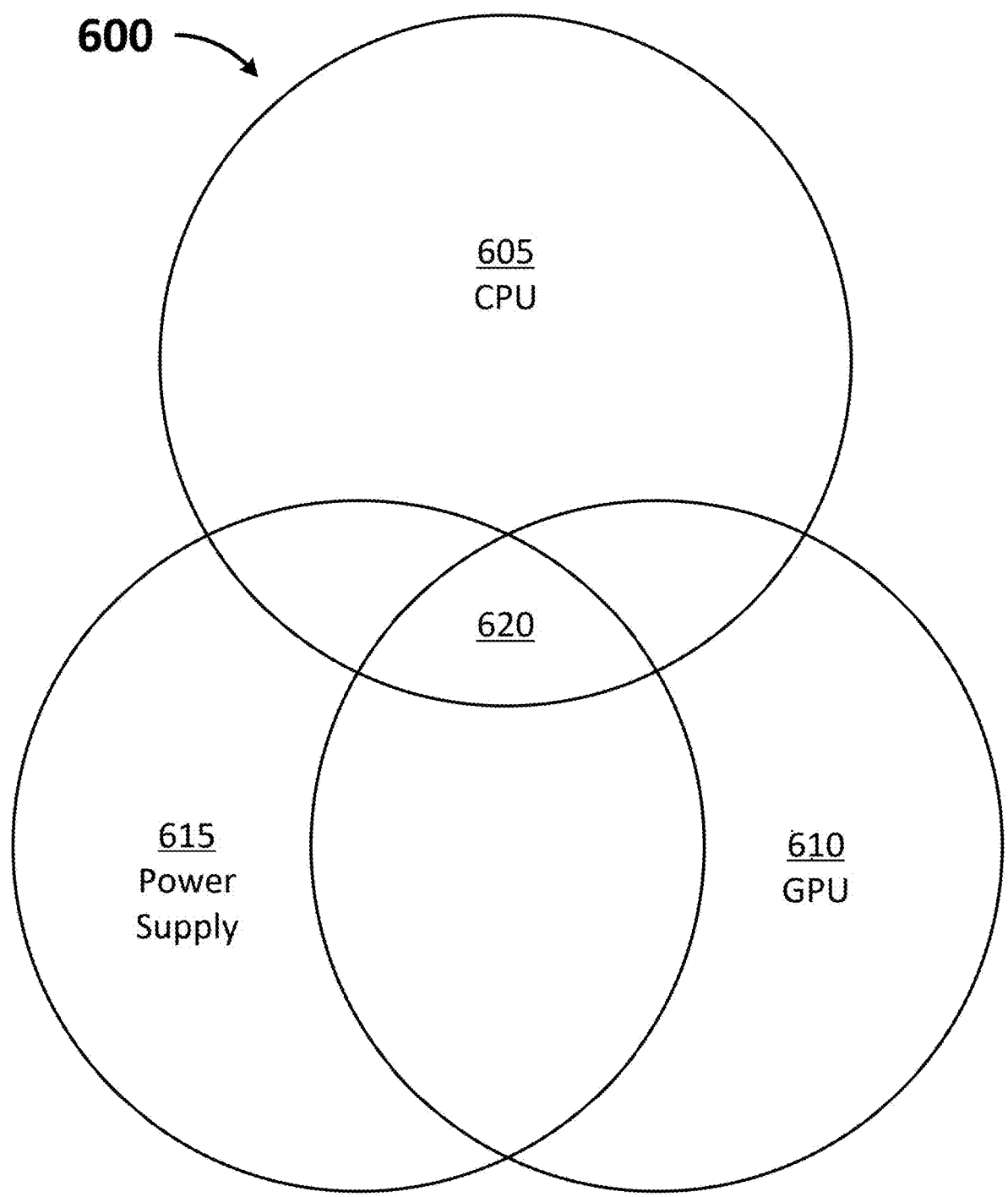
FIG. 6 shows an exemplary Venn diagram 600 for designing the PAPMCS in consideration with one or more thermal loads.

FIG. 6 shows an exemplary Venn diagram 600 for designing the PAPMCS in consideration with one or more thermal loads (e.g., the portable computer as described with reference to FIG. 1n some examples, the mobile computer 500 may be designed using the Venn diagram 600 to meet temperature requirements of components used.

As shown, as an illustrative example, the Venn diagram 600 may include heat distribution of a CPU 605, a GPU 610, and a power supply 615. In some implementations, the mobile computer 500 may be designed such that an aggregate temperature 620 of a combination of the components (605 610, 615), based on their separation distance, may be less than the minimum of the maximum allowed temperature of the components (605, 610, 615).

In some embodiments, such as disclosed at least with reference to component arrangement 140 in FIG. 1, component placement may be generated to minimize I(X; Y; Z;). For example, any combination of I( . . . ) may produce a "hotspot" (e.g., additive thermal loads). The component placement may, for example, be generated (e.g., calculated) at the time of build (e.g., at a time of electronics design), such as using manufacturer's suggested maximum temperatures as the maximum threshold. For example, if a battery manufacturer indicates a maximum operating temperature of 200 deg (F.) and a CPU manufacturer indicates a maximum operating temperature of 250 deg (F.), the component placement may be configured to create a collapsed field whereby neither reach that state and the greatest common multiple is where the fields begin to intersect. The distance of heat may, for example, be the same depending on the idle airflow of the device and where the device is expected to be used. Average pressure at sea level in the open air may, for example, be about 1013.25 millibars (https://en.wikipedia.org/wild/Atmospheric_pressure). A rule-of-thumb may, for example, be to calculate air pressure at 1 Newton per square meter. Edge cases may, for example, be configured separately (e.g., extremely high altitude without being in a pressurized cabin or room, in an extremely deep location without being pressurized such as Death Valley, California). In some embodiments configured for such environments, one or more Peltier cooling modules may be thermally coupled to one or more components (e.g., CPU 125, battery 130). For example, the Peltier cooling modules may be thermally coupled to the components with thermoplastic compound (e.g., CPU paste). A heatsink may, for example, be provided on the hot side of the Peltier. A Peltier module does add to the current load and thus generates additional heat. Accordingly, configuration with a Peltier module may occur at a design phase. Configuration may, for example, include the Peltier module(s) as component(s) in the collapsed field.

Some embodiments may, for example, avoid a fan in combination with a Peltier module (e.g., to avoid a condensation condition from too much low-pressure air being pressurized). In example tests with processors having high thermal sensitivity (e.g., artificially imposed by onboard sensors), such as, by way of example and not limitation, Intel I9-10880HK (available from Intel Corporation, Santa Clara, CA) in a closed wooden enclosure, the processor works without a Peltier module, but thermally limits itself down to a 70% full-usage factor. Adding a Peltier cooler brings it back up to 100%, and the wood naturally dissipates heat (e.g., better than metal and/or plastic enclosures).

Figure 7:
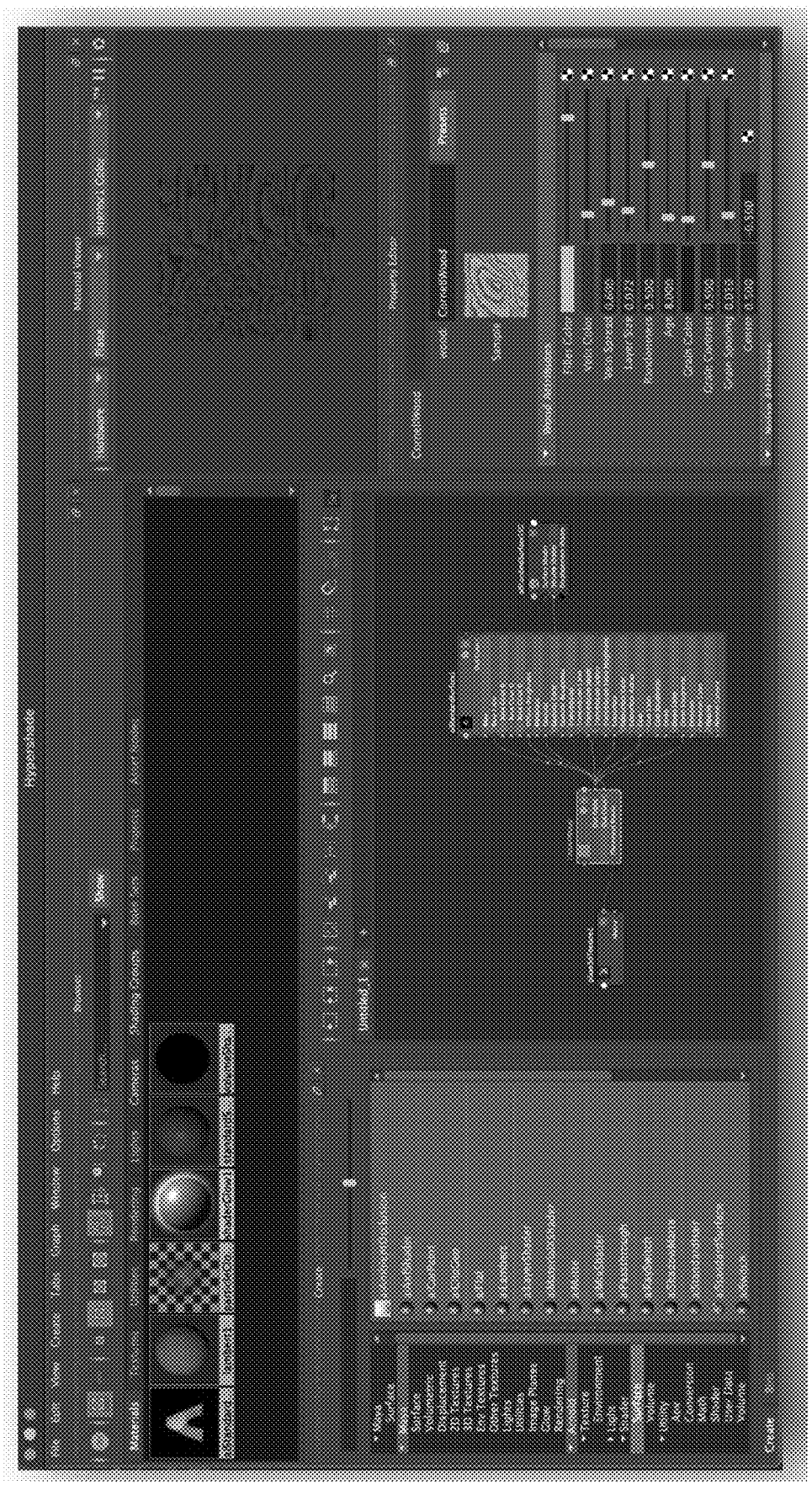
FIG. 7 shows an exemplary modeling user interface for a heat dissipating envelope. As shown, various textures, and rendering parameters may be introduced to simulate a heat dissipation behavior of the heat dissipating envelope.

FIG. 7 shows an exemplary modeling user interface for a heat dissipating envelope. As shown, various textures, and rendering parameters may be introduced to simulate a heat dissipation behavior of the heat dissipating envelope.

Figure 8:
FIG. 8 shows an exemplary embodiment of a modular mobile computer having multiple monitors.

FIG. 8 shows an exemplary embodiment of a modular mobile computer having multiple monitors.

Figure 9:
FIG. 9 shows an exemplary embodiment of a modular mobile computer having backpack connections for connection external breakout components.

FIG. 9 shows an exemplary embodiment of a modular mobile computer having backpack connections for connection external breakout components.

Figure 10:
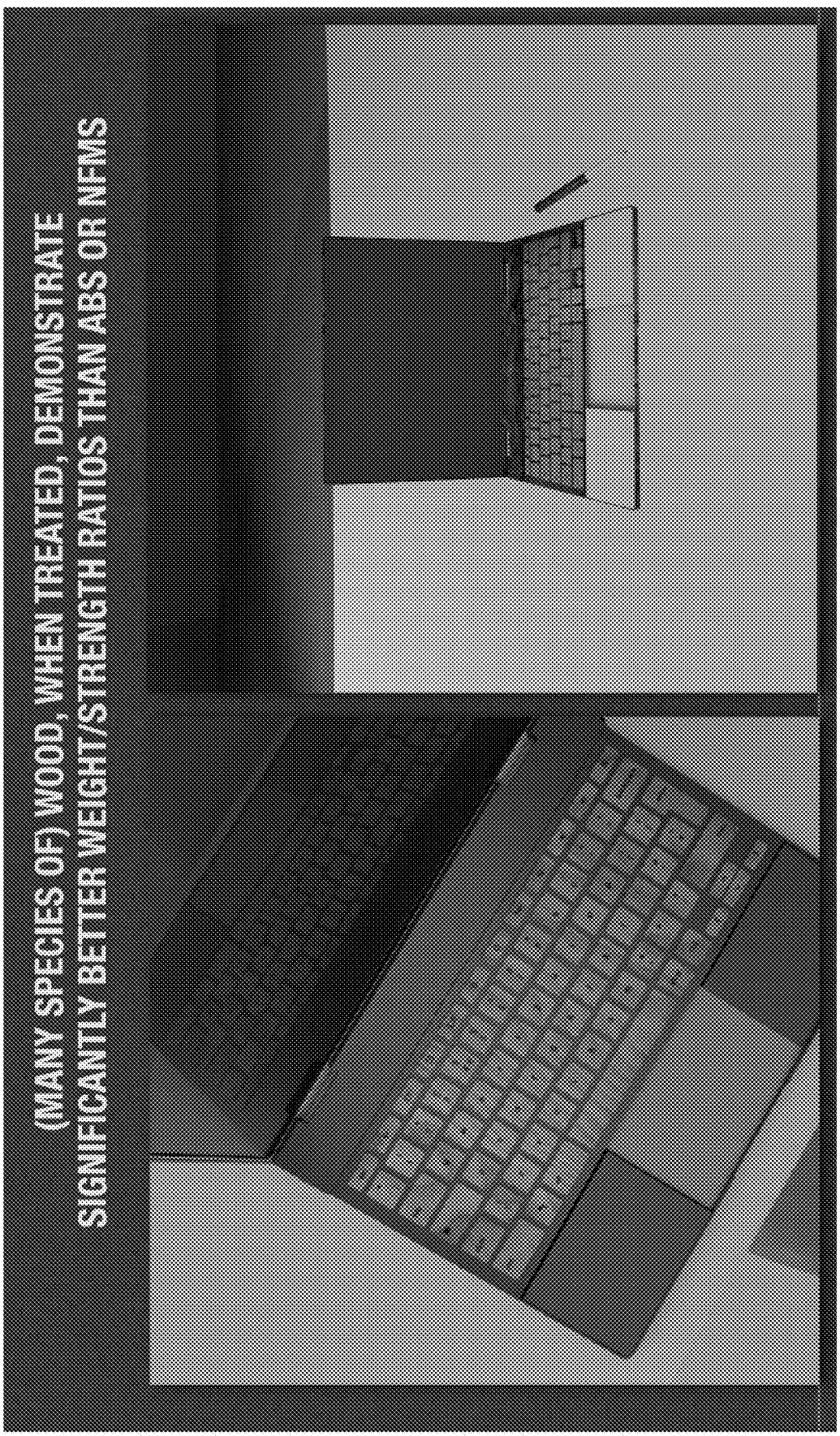
FIG. 10 shows an exemplary embodiment of a modular mobile computer having wood envelope with various types and/or treatments.

FIG. 10 shows an exemplary embodiment of a modular mobile computer having wood envelope with various types and/or treatments.

Figure 11:
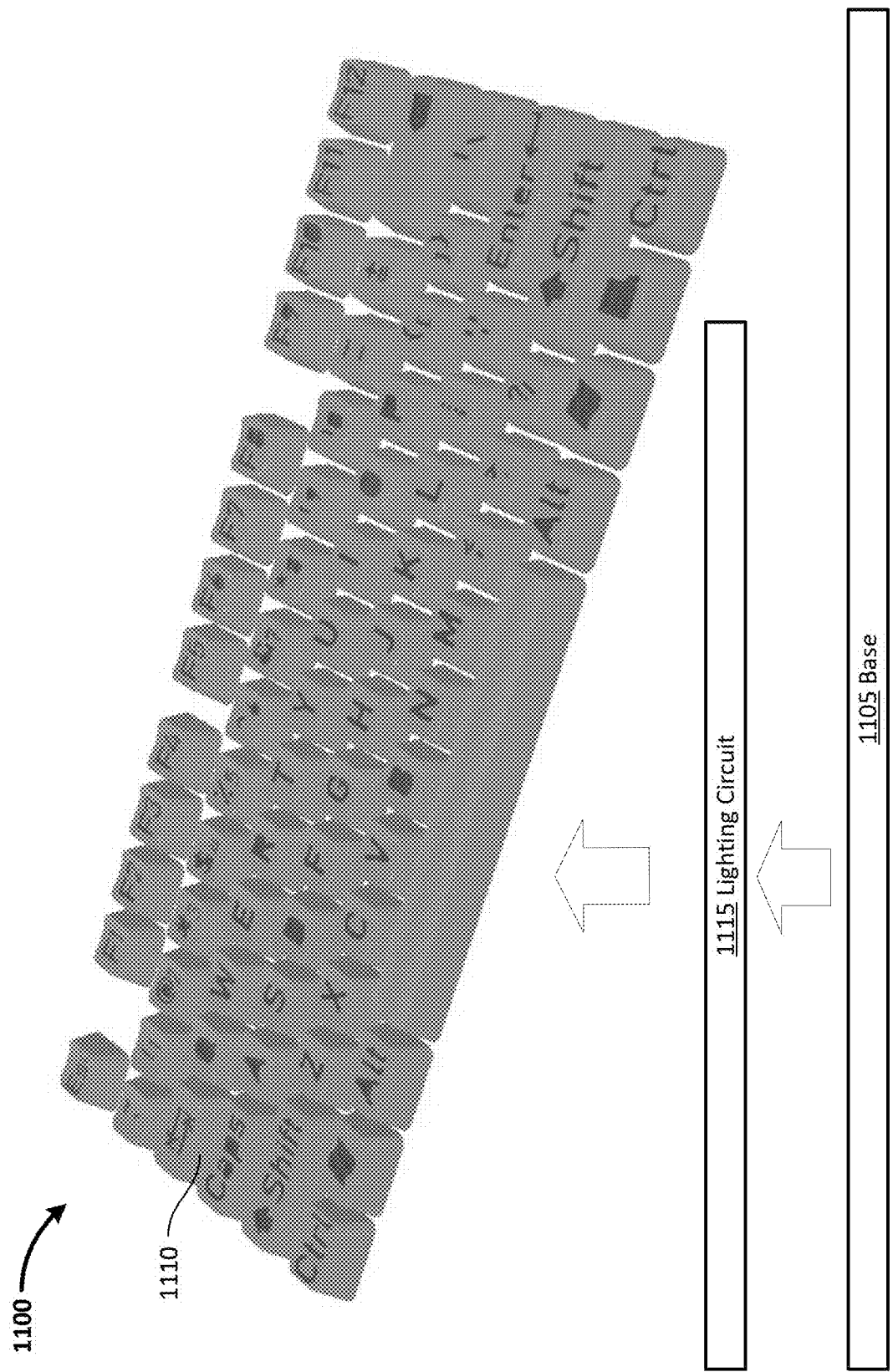
FIG. 11 is a schematic diagram showing an exemplary renewable keyboard.

FIG. 11 is a schematic diagram showing an exemplary renewable keyboard (RK 1100). For example, some or all materials used to produce the RK 1100 may be re-grown. In this example, the RK 1100 includes a base 1105. For example, the base 1105 may include a housing made of natural wood. For example, the base 1105 may include circuitry (e.g., power connection, dome-switch membrane circuit) for operating the RK 1100.

In some examples, the RK 1100 may be a mechanical keyboard (e.g., a cherry MX keyboard). In some examples, the RK 1100 may be a membrane keyboard. In this example, the RK 1100 includes wooden keys 1110 and a lighting circuit 1115. For example, the wooden keys 1110 may include light permissible legend(s) that may allow lighting to come through, making the RK 1100 a backlit keyboard. In some implementations, the RK 1100 may be manufactured without the lighting circuit.

Figure 12:
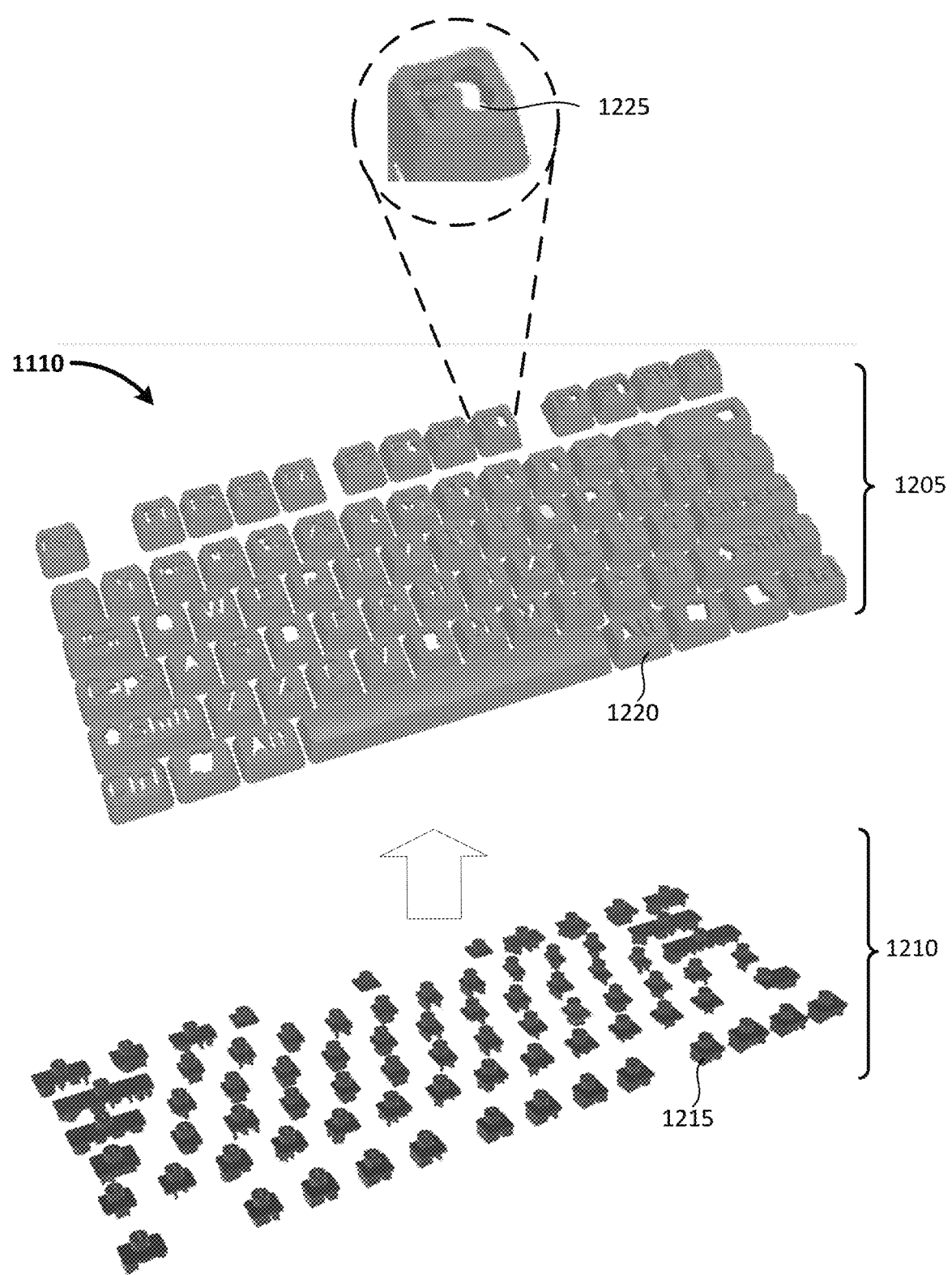
FIG. 12 is an exploded view of the exemplary renewable keyboard as described with reference to FIG. 11.

FIG. 12 is an exploded view of the exemplary renewable keyboard as described with reference to FIG. 11. In this example, the wooden keys 1110 includes a key unit 1205 and a legend unit 1210. For example, the key unit 1205 may be made of natural wood. For example, the legend unit 1210 may be made of renewable resin (e.g., organic wood resin, pine resin, pine acrylic, cherry resin, natural rubber resin). In various implementations, the key unit 1205 and the legend unit 1210 may form an interlocking connection. For example, each legend 1215 may be inserted into a corresponding key 1220.

In some implementations, the wooden keys 1110 may be produced in a two-part process. First, for example, the corresponding key 1220 may be produced with a corresponding receiving aperture 1225 reflecting a corresponding key in the RK 1100. For example, the receiving apertures 1225 may be die-stamped onto the wooden keys 1110. In some implementations, the wooden keys 1110 may be stamped with a desired shape.

In some implementations, the wooden keys 1110 may be made either from a complete subtractive process from a single core of wood (e.g., a 5-axis CNC creating a single key or the entire set of keys for a keyboard). In some implementations, in order to lower a barrier to production, a simpler 3-axis CNC process may mill a basic shape of a key. The legend may, for example, be made from a subtractive manufacturing technique using, for example, lignin-modified wood. In some examples, the legend may be made by an additive manufacturing technique. The legend(s) may be made using, for example, renewable resin (e.g., materials come from wood). By way of example and not limitation, the legend(s) may be made using renewable resin using a Selective Laser Sintering (SLS) printer. In some implementations, a Fused Deposition Modeling (FDM) additive manufacturing printer and/or process may be used. Various embodiments may advantageously provide multiple manufacturing processes to balance cost, ergonomics, user preference, intended usage, or a combination thereof, with keys made from renewable wood. For example, a 2-part legend process involving renewable resin with a machined basic key (e.g., the key unit 1205) may allow for subtractive machines with wider tolerances to create a key in smaller quantities. Tighter-tolerance machines, such as a newer 5-axis model, for example, may be less expensive over larger quantities but more expensive in lower quantities. In some implementations, the lower tolerance may also be advantageously implemented in larger quantities (e.g., using molding and/or casting).

In this example, the legends 1215 may be produced, for example, by 3D printing (e.g., SLS printing, FDM printing, photopolymerization additive manufacturing). For example, material used for printing the legends 1215 may be pine resin-based glue.

In some implementations, the legend materials, for example, may include a high light refraction rate. In some examples, the legends 1215 may allow light to pass through to advantageously provide a glowing keyboard. For example, using different resins for making the legend 1215, the RK 1100 may emit different glowing colors. In some implementations, the receiving apertures 1225 may be carved by laser-etching or using a solid computer numerical control (CNC) machining (e.g., 3 axis CNC). In some such cases, the RK 1100 may not have a backlit feature.

In various implementations, the printing material may include a high incidence of refraction to advantageously reduce hot spots. In some implementations, the legend 1215 may be produced using injection mode using moldable printing material (e.g., pine resin).

In various embodiments, renewable materials including the natural wood and the moldable/printable resin may be used in other applications to advantageously increase a renewability to mass ratio. For example, the renewable materials may be applied to electronics applications including smartphones and tablets, and for automobiles using electronic and mechanical devices which require a renewable translucent part. In some embodiments, lignin-modified translucent wood may be used.

In some implementations, similar techniques may be used to make wooden mice. For example, the wooden mice may be a mechanical mice made with renewable substances. For example, the wooden mice may include a wooden casing and a SLS printed, pine resin-based trackball. In various implementations, the wooden mice may be advantageously sustainable, repairable, and renewable.

Figure 13:
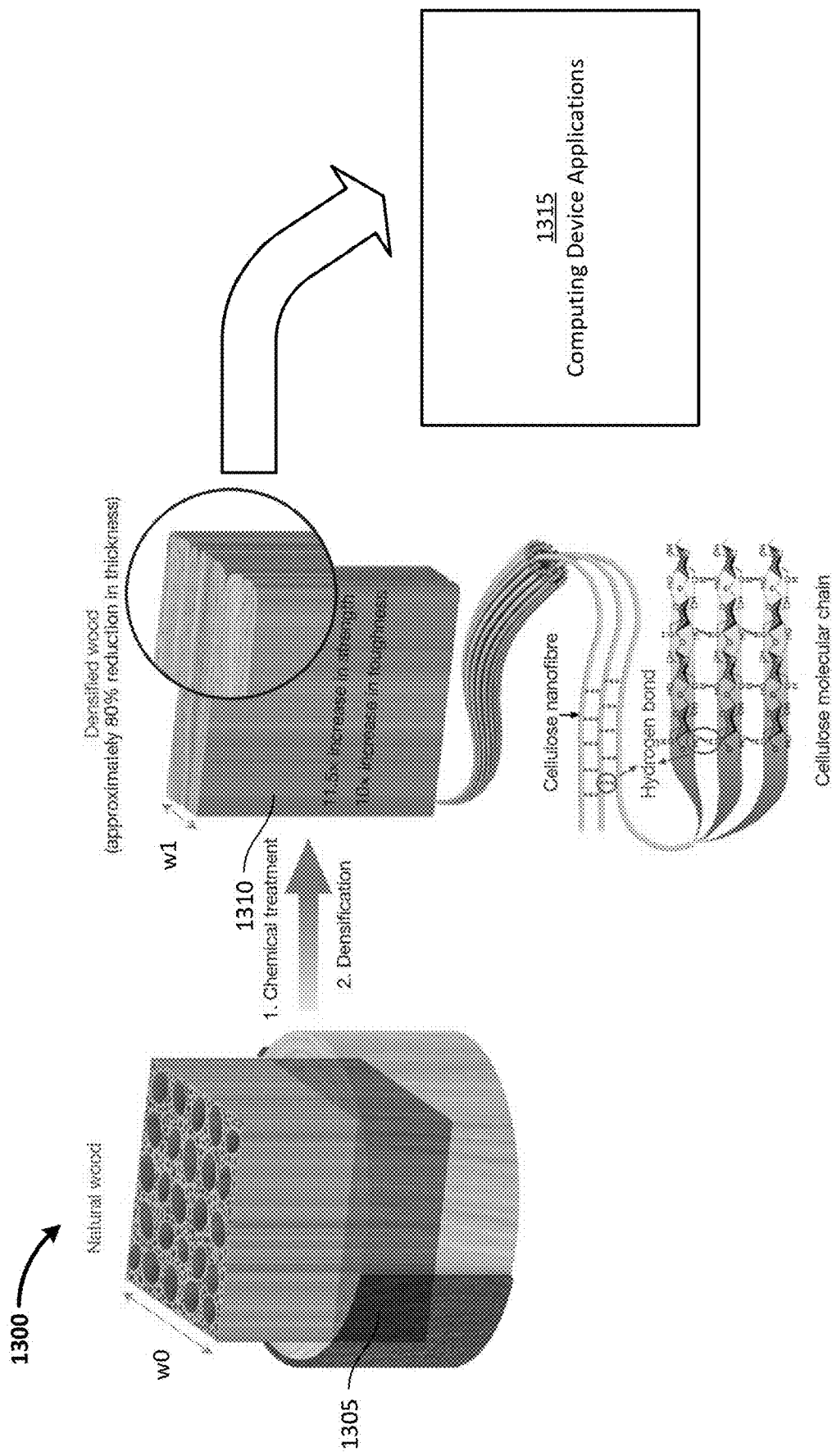
FIG. 13 depicts an exemplary process of processing a natural wood into a densified wood for manufacturing computing device applications.

FIG. 13 depicts an exemplary process 1300 of processing a natural wood 1305 into a densified wood 1310 for manufacturing computing device applications 1315. As shown, the process 1300 includes two-step to transforming the natural wood into the densified wood 1310. In a step 1, the process 1300 includes a chemical treatment to partially remove lignin and/or hemicellulose from the natural wood 1305. In a step 2, the process 1300 includes a densification process to, for example, mechanically hot-pressing the natural wood 1305 at 100° C. In some examples, the densification process may lead to a reduction in thickness of the natural wood about 80% (w1=0.8×w0).

As shown, the densified wood 1310 may include well aligned cellulose nanofibers to enhance hydrogen bond formation.

Figure 14:
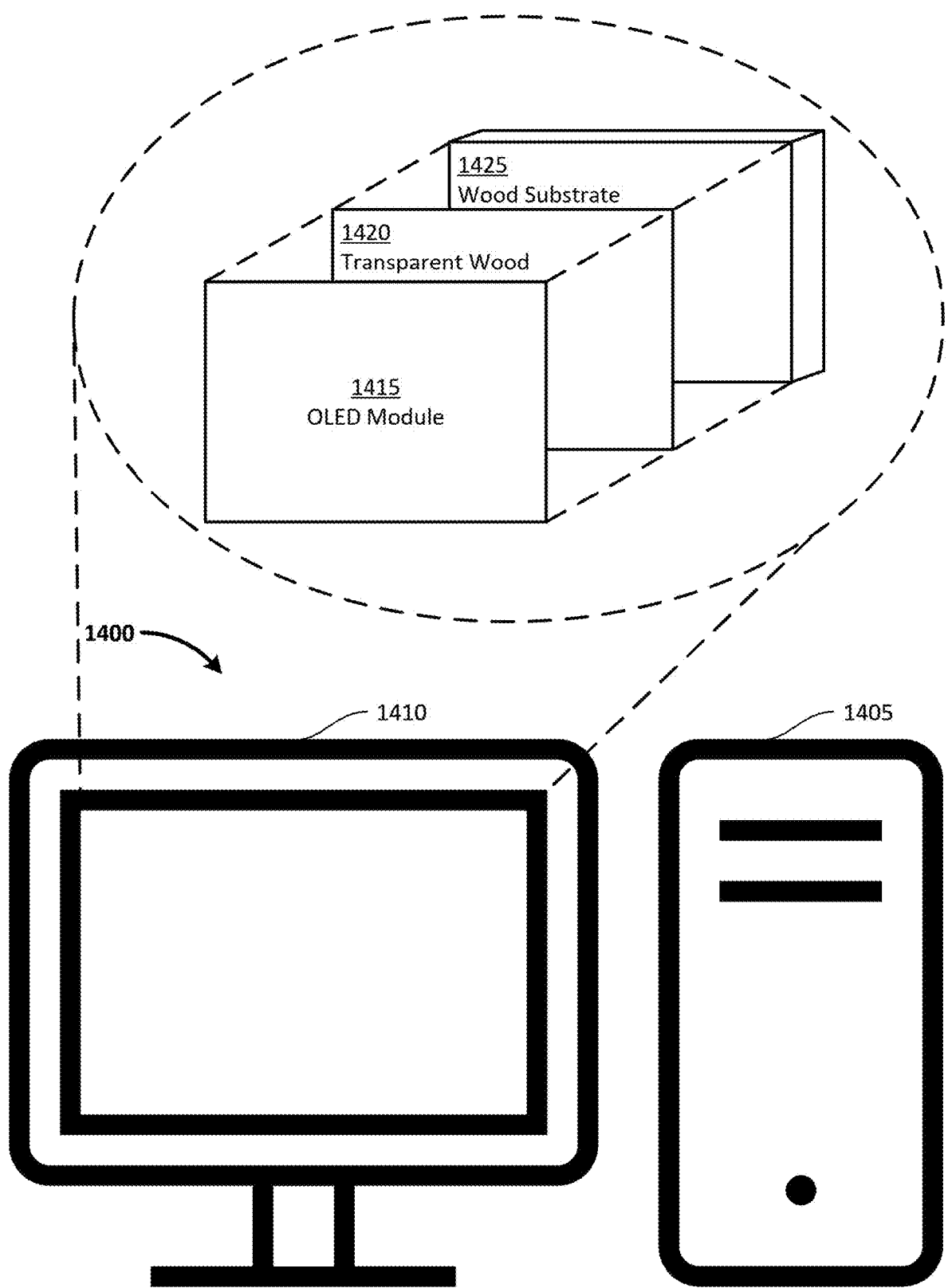
FIG. 14 depicts an exemplary desktop computer having an exemplary display using transparent wood.

The densified wood may, for example, be super-strong and tough (as described with experimental data with reference to FIG. 14). In some embodiments, the densified wood 1310 (e.g., Lignin-modified wood) may be used in the computing device applications 1315 (e.g., a desktop computer, a laptop, an autonomously powered modular computer system as described with reference to U.S. Provisional Application Ser. No. 63/364,106, and the entire contents of the foregoing application are incorporated herein by reference) as both a translucent medium (e.g., a desktop monitor screen, glass for a laptop's screen) and/or as a PC Board substrate. In various examples, the densified wood 1310 may advantageously increase a renewable material ratio of a computer to over 85%.

With respect to FIGS. 13-14, in some implementations the process may be performed using one or more steps and/or techniques described in "Processing bulk natural wood into a high-performance structural material," by Song, et al and published in Nature (554:224-228) on Feb. 8, 2018 (accessible at doi:10.1038/nature25476), submitted as an Appendix herewith and incorporated herein by reference as an illustrative process and results.

FIG. 1 of Song, et al., shows relative strength of an exemplary densified wood, as described by Song, et al. As shown, tensile strengths of various materials are displayed. As an illustrative example, resulting tensile strengths of an exemplary densified wood (422.2±36.3 MPa cm3 g−1, mean±standard deviation) may be higher than those of typical metals (the Fe—Al—Mn—C alloy, TRIPLEX and high-specific-strength steel, HSSS), and even of lightweight titanium alloy (Ti6A14V).

FIG. 14 depicts an exemplary desktop computer 1400 having an exemplary display 1405 using transparent wood. In various implementations, the desktop computer 1400 may employ methods and systems as described in U.S. Provisional Application Ser. No. 63/364,106 to provide thermally separated component design and surface features for passively cooling.

As shown in an exploded view of the display 1405, the display includes an OLED module (e.g., a monitor screen) 1415, a transparent wood 1420 and a wood substrate 1425. The transparent wood 1420 may, for example, be made from densified wood in a process described with reference to FIGS. 15-16. The wood substrate 1425 may, for example, be a printed circuit board (PCB) to provide electronic (e.g., copper) circuitry for operating the display 1410.

In some implementations, the wood substrate 1425 may include xenophosphorous arrays (e.g., carved in 3D like a 7-layer multiboard). For example, the wood substrate 1425 may respond to light visually up to 7000 centigrams. In some implementations, the wood substrate 1425 may include copper traces and/or planes injected by a phosphorous injection system. In some implementations, the wood substrate 1425 may include deflated copper (by heating the copper to flow through different levels of the wood substrate 1425). In some examples, the desktop computer 1400 may be 97-99% renewable, and/or 100% recyclable.

Figure 15:
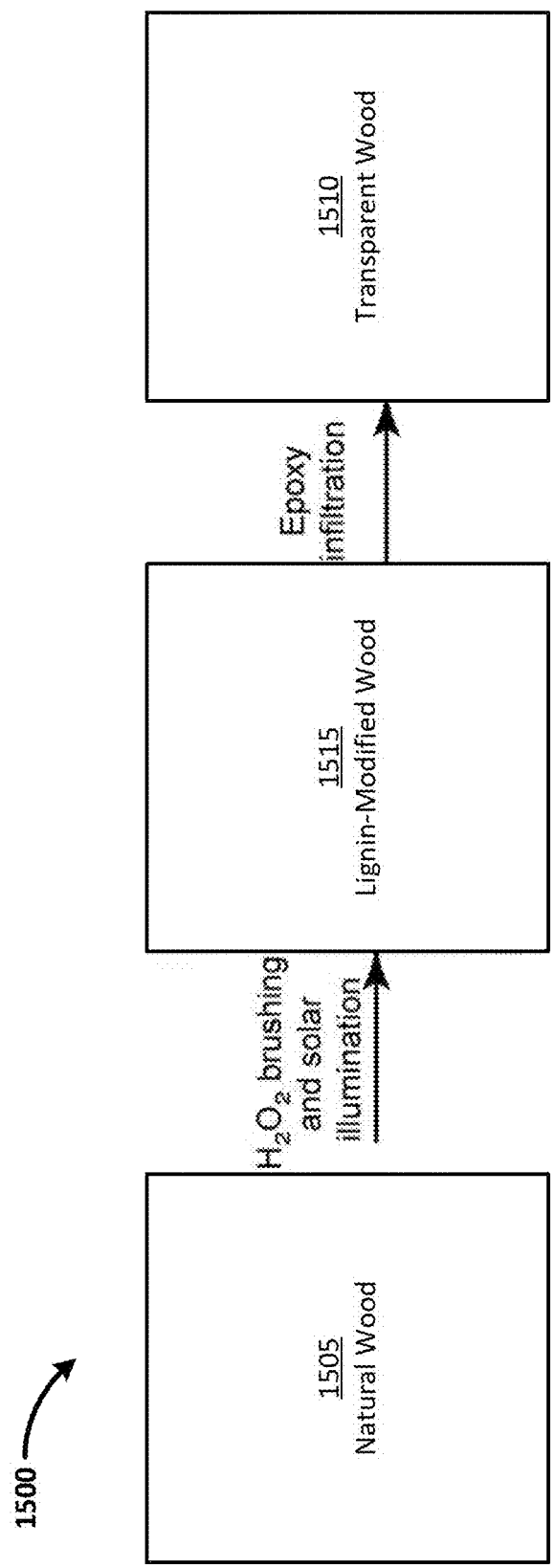
FIG. 15 depicts an exemplary process of processing a natural wood into a transparent wood.

FIG. 15 depicts an exemplary process 1500 of processing a natural wood 1505 into a transparent wood 1510. In this example, the natural wood 1505 is processed with chemical ($H_2O_2$) brushing and solar illumination. For example, lignin chromophore and hemicellulose of the natural wood 1505 may be removed by this process. In this example, the natural wood 1505 becomes a colorless, lignin-modified wood 1515. For example, the modified lignin may bind and wrap around cellulose microfibrils to maintain mechanical properties of the lignin-modified wood 1515. Next, epoxy is infiltrated into the lignin-modified wood 1515 to make the transparent wood 1510. The resulting wood may, by way of example and not limitation, be stronger than Aluminum 6061 (e.g., higher tensile strength).

Figure 16:
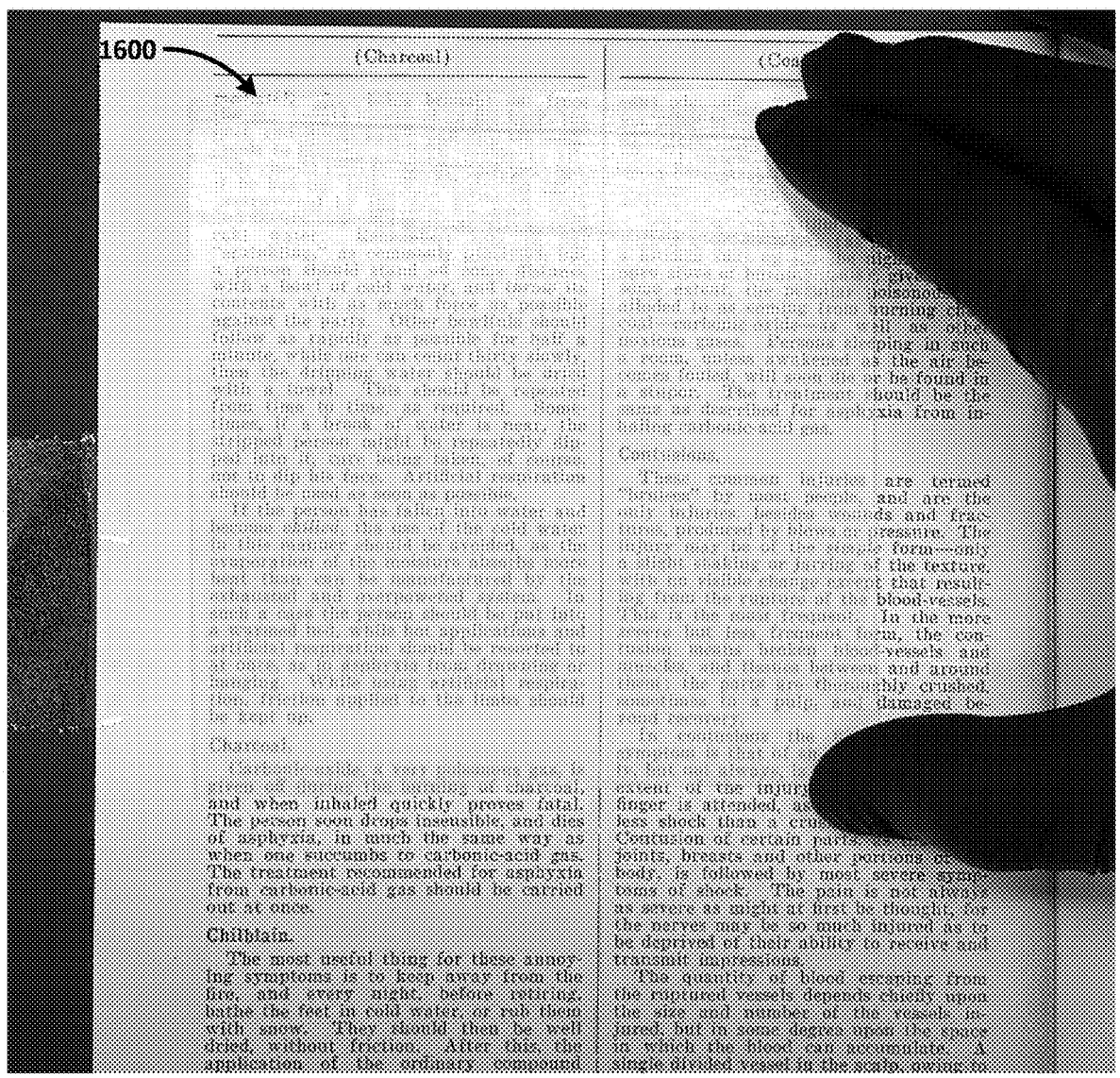
FIG. 16 shows an exemplary transparent wood.

FIG. 16 shows an exemplary transparent wood. For example, the transparent wood 1600 may be fabricated using the process 1500. In some implementations, the lignin-modified wood 1515 may be produced from natural wood using methyl chloride. In various implementations, the process 1500 may be performed substantially without toxic substance and uniformity. In some implementations, the transparent wood 1600 may be used in the display 1410 after polishing. Accordingly, for example, the process 1500 may be advantageously eco-friendly, scalable, and low-cost to fabricate transparent wood.

In some implementations, by way of example and not limitation, the process and/or products described with respect to FIGS. 14-16 may be performed and/or made according to one or more steps described in "Solar-assisted fabrication of large-scale, patternable transparent wood" by Xia, et al., and published Jan. 27, 2021 in Science Advances (7: eabd7342) (accessed at https.//www.science.org/doi/10.1126/sciadv.abd7342), submitted herewith as an Appendix and incorporated herein by reference as an illustrative process and results.

Figure 17A:
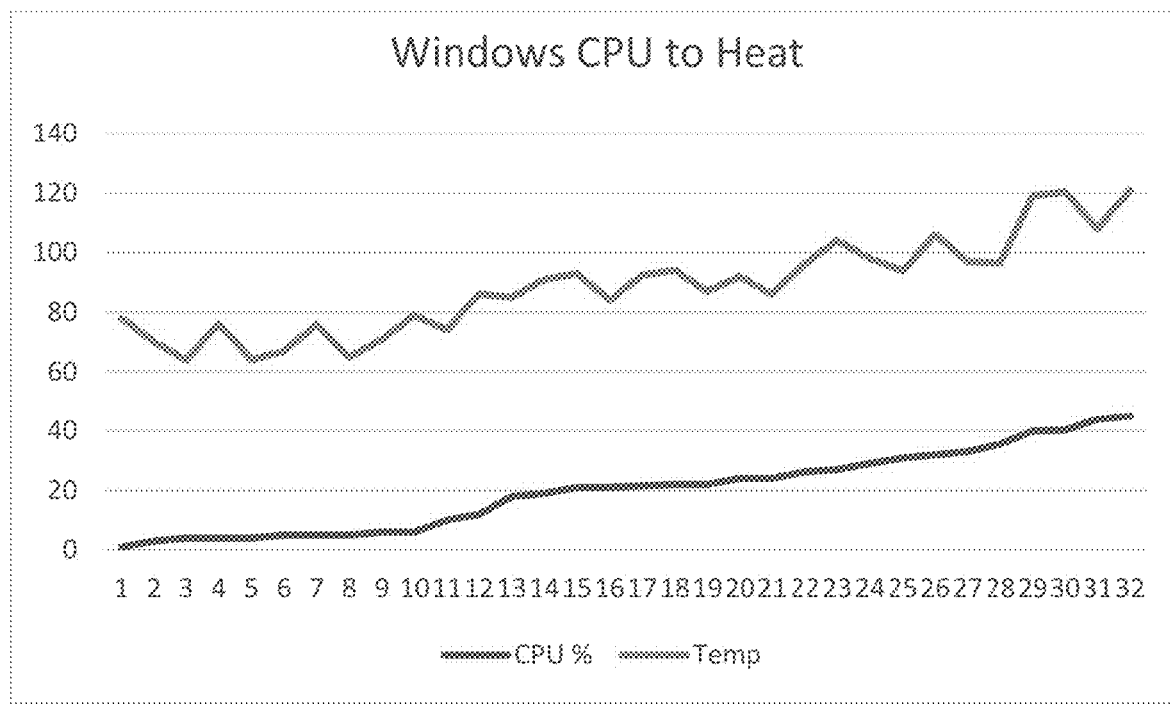
FIG. 17A, FIG. 17B, and FIG. 17C depict exemplary experimental results of thermal dynamic behaviors of wooden electronics envelope(s).
Figure 17B:
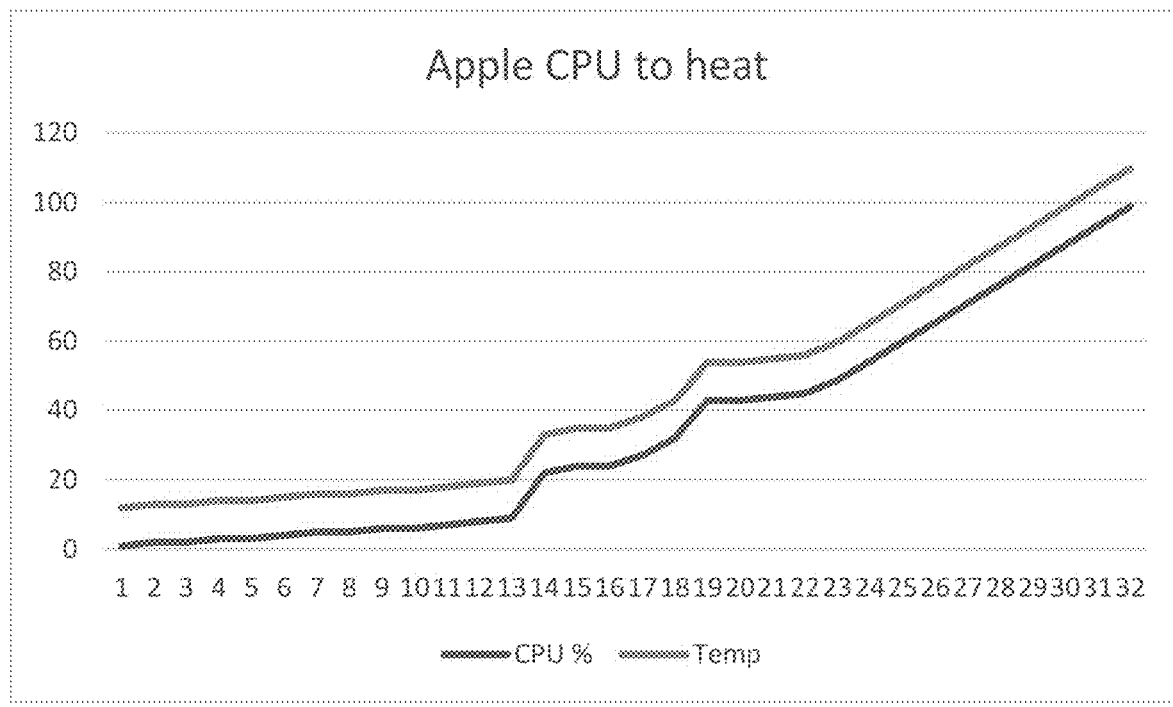
Figure 17C:
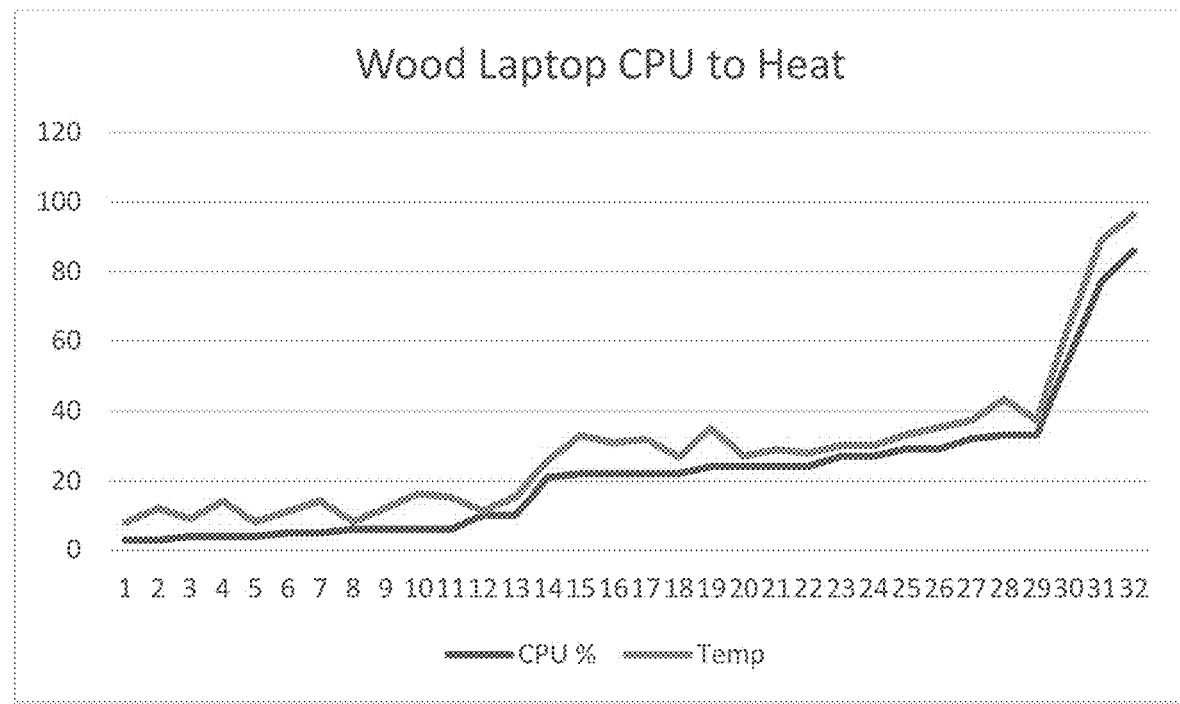

FIG. 17A, FIG. 17B, and FIG. 17C depict exemplary experimental results of thermal dynamic behaviors of wood. In this illustrative test, a piezoelectric sensor along with a simple LoRA squawker was inserted inside three laptops: an Apple M1 Pro MacBook, a Lenovo Windows 11 laptop, and a wooden laptop. For example, the wooden laptop may be a portable autonomously powered modular computer system having a wooden casing as described with reference to FIG. 1 of U.S. Provisional Application Ser. No. 63/364,106. As shown, the results display CPU usage and a measured temperature of the CPU. In various examples, the CPU usage may vary depending on an application or a state of an operating system of the computing device. As shown in FIG. 17A, an Apple M1 Pro core heats up when the CPU usage increases. As shown in FIG. 17, Microsoft Windows 11 heats up exponentially with CPU usage.

As shown in FIG. 17C, a wood laptop (e.g., a portable autonomously powered modular computer system, such as disclosed at least with reference to FIGS. 1, 5, and 8-10 of U.S. Provisional Application Ser. No. 63/364,106, incorporated herein by reference in its entirety), also running a Microsoft Windows 11 operating system, ran much cooler when the CPU usage went up. In some examples, the difference between the two Windows PCs, as shown in FIGS. 17B and 17C, is overall about 16% reduction in heat. The difference between the wood laptop and the Apple M1 pro is around 7%. As shown, electronics stay cooler in wooden casing at comparable CPU usage.

For example, as disclosed at least with reference to FIGS. 1-6 of U.S. Provisional Application Ser. No. 63/364,106 (incorporated herein by reference in its entirety), and without being bound to a particular theory, the wooden laptop case may induce a certain level of turbulence such that warmer air enters microtubules of the wooden case and is carried away from the heat source (e.g., the CPU). FIGS. 17A-17C illustrate actual test results demonstrating that, in analogous situations (e.g., environment, ambient temperature, performance, use) the wooden case such as described in the 63/364,106 application, maintains a lower thermal temperature of the CPU (e.g., by enhancing removal of excess thermal energy).

Although various embodiments have been described with reference to the figures, other embodiments are possible. For example, in some implementations, some designs of the RK 1100 may enable low-tolerance manufacturing. In some implementations, the wooden laptop (as described with reference to FIG. 17C) may be pocketized. For example, a layout of the component of the wooden laptop may be further aligned so that more air may flow through within the laptop.

In some implementations, wooden components (e.g., a case, keyboard components, mouse components, circuit board substrate, monitor substrate) may be stabilized. For example, a wooden component may be processed to remove oxygen and/or other environmental components. For example, the wooden component may be processed in a vacuum chamber and/or vacuum seal machine. In some implementations, a filler may be provided in the wood (e.g., epoxy). In some implementations, filler may be avoided in at least a portion of the wood to maintain thermal properties (e.g., open microtubules, surface texture) that may be useful and/or needed for cooling. In some implementations, no filler may be used. Test results indicate that stabilization, with or without filler, reduces or eliminates a wooden component's tendency to warp in a humid environment.

In some implementations, a wood species may be chosen for a particular target environment. For example, amber may be selected for wet environments (e.g., due to resistance to moisture pickup and/or warping). In some implementations, a wooded component may be impregnated with water resistant features while maintaining open channels in the microtubules (e.g., by impregnating while maintaining a pressure across an open grain end of the wooden component).

In some implementations, optically translucent wooden components may be made by slicing the wood at a desired thinness.

In some implementations, optically translucent or transparent wooden components may be made from plant resin. For example, some components may be made from wood-resin acrylic (e.g., pine resin acrylic). The components may, for example, be cast, molded, and/or machined.

In some implementations, an organic thermal envelope may be subtractively manufactured. For example, a computer case may be made from a single block of wood. Tests indicate that the exchange of heat may be about 5-8% higher than an assembled case. For example, the pattern of the contour may be the same on both sides of the "envelope" (e.g., laptop case) so the piece of wood may be acting like it once did in nature: distributing heat outward in an efficient way according to its nanostructure. Results indicate that thermal improvements may be achieved with both softwoods and hardwoods. By way of example and not limitation, thermodynamic benefit may be achieved by using materials which have a molecular structure similar or the same in density for a thermal envelope. A continuous organic material envelope may, by way of example and not limitation, reduce or eliminate airflow loss and/or airflow insulation, thereby, for example, avoiding noisy entrapment which may lead to molecules bumping into one another and creating their own heat.

In some embodiments implementing wooden keyboards, a 10% medial temperature difference has been measured between a 10 mm cased laptop bottom with plastic keys versus solid wood keys. Without being bound to a particular theory, the wood may, for example, be allowing heat to escape (e.g., acting as a dialectic). In tests, the temperature of the wood keyboard in a wood laptop has been measured as at least a few degrees higher than that of a plastic keycap keyboard. The difference may, for example, be unnoticeable to a user (e.g., due to a relatively low temperature of the keys relative to the rest of a computer), but the wood may, for example, allow the heat escape as opposed to the plastic insulating it.

In an illustrative example, a MacBook Pro keyboard was replaced with a keyboard with wooden keys. No other components were replaced. The ambient temperature, after booting, inside of the laptop case of the MacBook Pro was 87° F. with its original keyboard. The ambient temperature, after booting, inside of the laptop case of the MacBook Pro after the wooden keys were installed was 83° F., corresponding to a 5° F. drop.

In an illustrative example, the keyboard keys of a Google Pixel book was replaced with wooden keys, and a 3.5° F. drop was achieved compared to the original (plastic) keys. This result is particularly surprising because an Android-based computer (like the Google Pixel book) has a relatively low heat footprint.

In some implementations, a device may, for example, be re-cased with an organic thermal envelope (e.g., wooden case). For example, a mobile device may be re-cased. A laptop may, for example, be re-cased. A desktop computer may, for example, be re-cased. A server may, for example, be re-cased. The case may, for example, be machined from wood. For example, in addition to the protective cover, the chassis of the device may be replaced with a thermally advantageous case (e.g., wooden case/chassis). Such implementations may, by way of example and not limitation, advantageously reduce thermal energy of the components, which may, for example, lead to a longer battery life and/or longer life of other electronic components.

In some implementations, by way of example and not limitation, a thermal envelope may be a mix of organic (e.g., wooden), insulative/thermally resistant components, and/or reflective components. For example, a portion of a thermal envelope may be constructed to direct thermal energy away from and/or insulate thermal energy from contact with a user. As an illustrative example, a portion of the case likely to be in contact with a user may be sealed (e.g., varnished, polyurethane coated, painted) to redirect thermal energy to exit in other regions.

In some implementations, a cover may be made from one or more layers of flexible material. For example, polycarbonate sheet and/or organic sheet (e.g., wood resin, lignin-modified wood, compressed wood, thin-sliced wood) may be polished to a high polish to simulate glass-like-clarity. The flexibility of the cover may resist shattering. For example, tests with polycarbonate have resisted shattering when impacted with tools (e g, hammer, screwdriver). The flexibility of the material may, for example, allow the material to deflect slightly (e.g., without damaging internal components) to resist shattering. In some implementations, the flexible material may be applied to a layer of glass and/or a layer of glass may be bonded (e.g., adhesive) to the flexible material.

Although an exemplary system has been described with reference to FIG. 1, other implementations may be deployed in other industrial, scientific, medical, commercial, and/or residential applications.

In various embodiments, some bypass circuits implementations may be controlled in response to signals from analog or digital components, which may be discrete, integrated, or a combination of each. Some embodiments may include programmed, programmable devices, or some combination thereof (e.g., PLAs, PLDs, ASICs, microcontroller, microprocessor), and may include one or more data stores (e.g., cell, register, block, page) that provide single or multi-level digital data storage capability, and which may be volatile, non-volatile, or some combination thereof. Some control functions may be implemented in hardware, software, firmware, or a combination of any of them.

Computer program products may contain a set of instructions that, when executed by a processor device, cause the processor to perform prescribed functions. These functions may be performed in conjunction with controlled devices in operable communication with the processor. Computer programs products, which may include software, may be stored in a data store tangibly embedded on a storage medium, such as an electronic, magnetic, or rotating storage device, and may be fixed or removable (e.g., hard disk, floppy disk, thumb drive, CD, DVD).

Although an example of a system, which may be portable, has been described with reference to the above figures, other implementations may be deployed in other processing applications, such as desktop and networked environments.

Temporary auxiliary energy inputs may be received, for example, from chargeable or single use batteries, which may enable use in portable or remote applications. Some embodiments may operate with other DC voltage sources, such as nominal batteries, for example. Alternating current (AC) inputs, which may be provided, for example from a 50/60 Hz power port, or from a portable electric generator, may be received via a rectifier and appropriate scaling. Provision for AC (e.g., sine wave, square wave, triangular wave) inputs may include a line frequency transformer to provide voltage step-up, voltage step-down, and/or isolation.

Although particular features of an architecture have been described, other features may be incorporated to improve performance. For example, caching (e.g., L1, L2, . . . ) techniques may be used. Random access memory may be included, for example, to provide scratch pad memory and or to load executable code or parameter information stored for use during runtime operations. Other hardware and software may be provided to perform operations, such as network or other communications using one or more protocols, wireless (e.g., infrared) communications, stored operational energy and power supplies (e.g., batteries), switching and/or linear power supply circuits, software maintenance (e.g., self-test, upgrades), and the like. One or more communication interfaces may be provided in support of data storage and related operations.

Some systems may be implemented as a computer system that can be used with various implementations. For example, various implementations may include digital circuitry, analog circuitry, computer hardware, firmware, software, or combinations thereof. Apparatus can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Various embodiments can be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and CD-ROM and DVD-ROM disks. The processor and the memory can be supplemented by, or incorporated in, ASICs (application-specific integrated circuits).

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. Various embodiments may be implemented in a computer system that includes a graphical user interface and/or an Internet browser. To provide for interaction with a user, some implementations may be implemented on a computer having a display device, such as a CRT (cathode ray tube) or LCD (liquid crystal display) monitor for displaying information to the user, a keyboard, and a pointing device, such as a mouse or a trackball by which the user can provide input to the computer.

In various implementations, the system may communicate using suitable communication methods, equipment, and techniques. For example, the system may communicate with compatible devices (e.g., devices capable of transferring data to and/or from the system) using point-to-point communication in which a message is transported directly from the source to the receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, the computers and networks forming the Internet, or some combination thereof. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, Firewire, ATA/IDE, RS-232, RS-422, RS-485, 802.11a/b/g, Wi-Fi, Ethernet, IrDA, FDDI (fiber distributed data interface), token-ring networks, multiplexing techniques based on frequency, time, or code division, or some combination thereof. Some implementations may optionally incorporate features such as error checking and correction (ECC) for data integrity, or security measures, such as encryption (e.g., WEP) and password protection.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

Various examples of modules may be implemented using circuitry, including various electronic hardware. By way of example and not limitation, the hardware may include transistors, resistors, capacitors, switches, integrated circuits, other modules, or some combination thereof. In various examples, the modules may include analog logic, digital logic, discrete components, traces and/or memory circuits fabricated on a silicon substrate including various integrated circuits (e.g., FPGAs, ASICs), or some combination thereof. In some embodiments, the module(s) may involve execution of preprogrammed instructions, software executed by a processor, or some combination thereof. For example, various modules may involve both hardware and software.

In an illustrative aspect, a computing device may include heat generating electronic components that may include a processor and a memory. The computing device may include a passive cooling structure disposed between the heat generating electronic components and a cooling region configured to induce thermal energy flow out of a volume around each of the heat generating electronic components. For example, the passive cooling structure may include an anisotropic surface texture configured to passively induce air vorticity in response to a thermal gradient. For example, the passive cooling structure may include a microchannel substructure. The microchannel substructure may include tubules. For example, each of the tubules may include a tubule wall defines a lumen extending away from the heat generating electronic components, and the tubule wall may be permeable in response to a thermal-gradient induced pressure differential.

For example, when heat energy may be generated from the heat generating electronic components, the volume around the heat generating electronic components may be in fluid communication with the cooling region by convection generated by a pressure differential and air flow induced by the anisotropic surface texture, radiation, and reflection.

For example, the heat generating electronic components further may include a power regulation circuit. For example, the heat generating electronic components may include a digital display device. For example, the digital display device may include a wood circuit board disposed behind a transparent and lignin-modified wooden display layer.

For example, the passive cooling structure bound each of the heat generating electronic components such that the passive cooling structure defines a totally enclosed envelop around each of the heat generating electronic components such that the microchannel substructure may be exposed at an outer surface of the computing device. For example, the computing device does not include a cooling fan.

For example, the heat generating electronic components may be disposed at predetermined distances from each other based on a placement pattern generated such that heat sensitive components may be placed away from the heat generating electronic components.

For example, the placement pattern may be generated as a function of an aggregate temperature of a combination of adjacent heat generating electronic components and a maximum operating temperature threshold of each of the heat generating electronic components.

For example, the passive cooling structure defines at least one heat generating cavity such that the heat generating electronic components may be thermally isolated from each other by the passive cooling structure. For example, the heat generating electronic components may be each pluggably and interchangeably coupled to a spatially separated connection hub circuit.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations may be contemplated within the scope of the following claims.

What may be claimed is:

1. A computing device comprising:
   a plurality of heat generating electronic components comprising a processor; and,
   a passive cooling structure disposed between the plurality of heat generating electronic components and a cooling region, wherein the passive cooling structure is configured to induce thermal energy flow out of a volume around each of the plurality of heat generating electronic components, wherein the passive cooling structure comprises:
   an anisotropic surface texture configured to passively induce air motion in response to a thermal gradient, and,
   a microchannel substructure comprising tubules, wherein each of the tubules comprises a tubule wall defines a lumen extending away from the plurality of heat generating electronic components, and the tubule wall is permeable in response to a thermal-gradient induced pressure differential, such that,
   when heat energy is generated from the plurality of heat generating electronic components, the volume around the plurality of heat generating electronic components is in fluid communication with the cooling region by convection generated by a pressure differential and air flow induced by the anisotropic surface texture.

2. The computing device of claim 1, wherein the plurality of heat generating electronic components further comprises a power regulation circuit.

3. The computing device of claim 1, wherein the plurality of heat generating electronic components further comprises a digital display device.

4. The computing device of claim 3, wherein the digital display device comprises a wood circuit board disposed behind a transparent and lignin-modified wooden display layer.

5. The computing device of claim 1, wherein the plurality of heat generating electronic components further comprises a light emitting display circuit.

6. The computing device of claim 1, wherein the passive cooling structure bound each of the plurality of heat generating electronic components such that the passive cooling structure defines a totally enclosed envelop around each of the plurality of heat generating electronic components such that the microchannel substructure is exposed at an outer surface of the computing device.

7. The computing device of claim 1, wherein the computing device does not comprise a cooling fan.

8. The computing device of claim 1, wherein the plurality of heat generating electronic components are disposed at predetermined distances from each other based on a placement pattern generated such that heat sensitive components are placed away from the plurality of heat generating electronic components.

9. The computing device of claim 8, wherein the placement pattern is generated as a function of an aggregate temperature of a combination of adjacent heat generating electronic components and a maximum operating temperature threshold of each of the plurality of heat generating electronic components.

10. The computing device of claim 1, wherein the passive cooling structure defines at least one heat generating cavity such that the plurality of heat generating electronic components are thermally isolated from each other by the passive cooling structure.

11. The computing device of claim 1, wherein the plurality of heat generating electronic components is each pluggably and interchangeably coupled to a spatially separated connection hub circuit.

12. The computing device of claim 1, further comprising a memory module.

13. The computing device of claim 1, wherein the air motion comprises local vorticity.

14. The computing device of claim 1, wherein the air motion comprises local vorticity.

15. The computing device of claim 1, wherein the microtubules are exposed on an outer surface such that the microtubules of the passive cooling structure provide a path of fluid communication between the heat generating electronic components and an exterior.

16. The computing device of claim 1, wherein the passive cooling structure is configured as a housing for the heat generating electronic components.

* * * * *